US012635399B2

(12) United States Patent
Zhang

(10) Patent No.: US 12,635,399 B2
(45) Date of Patent: May 19, 2026

(54) DISPLAY DEVICE AND METHOD FOR PRODUCING DISPLAY DEVICE

(71) Applicant: SHARP KABUSHIKI KAISHA, Sakai City (JP)

(72) Inventor: Bai Zhang, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 490 days.

(21) Appl. No.: 18/280,566

(22) PCT Filed: Mar. 29, 2021

(86) PCT No.: PCT/JP2021/013243

§ 371 (c)(1),
(2) Date: Sep. 6, 2023

(87) PCT Pub. No.: WO2022/208596

PCT Pub. Date: Oct. 6, 2022

(65) Prior Publication Data

US 2024/0180017 A1 May 30, 2024

(51) Int. Cl.

*H10K 77/10* (2023.01)
*H10K 59/12* (2023.01)
*H10K 59/122* (2023.01)
*H10K 59/80* (2023.01)
*H10K 102/00* (2023.01)

(52) U.S. Cl.

CPC ....... *H10K 77/111* (2023.02); *H10K 59/1201* (2023.02); *H10K 59/122* (2023.02); *H10K 59/873* (2023.02); *H10K 59/877* (2023.02); *H10K 59/878* (2023.02); *H10K 2102/311* (2023.02)

(58) Field of Classification Search

CPC ............. H10K 59/122; H10K 59/1201; H10K 59/873; H10K 77/111; H10K 2102/311

See application file for complete search history.

(56) References Cited

U.S. PATENT DOCUMENTS

2017/0294621 A1 10/2017 Higano et al.
2020/0201090 A1* 6/2020 Chen ..................... G02F 1/1309
2022/0037618 A1* 2/2022 Li ...................... H10K 59/8731

FOREIGN PATENT DOCUMENTS

CN 110265577 A * 9/2019 ......... H10K 50/8428
CN 114335101 A * 4/2022 ........... H10K 59/878
JP 2017-187705 A 10/2017

* cited by examiner

*Primary Examiner* — Mariceli Santiago

(74) *Attorney, Agent, or Firm* — ScienBiziP, P.C.

(57) ABSTRACT

A display device includes: a substrate that is flexible; a protruding portion having a side surface at least partially including a reverse-tapered surface on the substrate; and a sealing layer containing a self-repairing material. Furthermore, the display device includes a recessed space formed with the side surface of the protruding portion and a surface on which the protruding portion is formed. Moreover, the sealing layer convers: the side surface and an upper surface of the protruding portion; and a lower surface of the recessed space, and the recessed space has a side surface at least partially including the reverse-tapered surface.

20 Claims, 18 Drawing Sheets

START

FORM SUBSTRATE — S2

FORM ANODE — S4

DEPOSIT BANK MATERIAL — S6

EXPOSE BANK MATERIAL TO LIGHT — S8

DEVELOP BANK MATERIAL — S10

FORM LIGHT-EMITTING LAYER — S12

DEPOSIT PROTRUDING PORTION MATERIAL — S14

EXPOSE PROTRUDING PORTION MATERIAL TO LIGHT — S16

DEVELOP PROTRUDING PORTION MATERIAL — S18

FORM CATHODE — S20

DEPOSIT INORGANIC SEALING FILM — S22

DEPOSIT ORGANIC SEALING FILM — S24

END

DISPLAY DEVICE AND METHOD FOR PRODUCING DISPLAY DEVICE

TECHNICAL FIELD

The present disclosure relates to a display device including a multilayer light-emitting element, and a method for producing the display device.

BACKGROUND ART

Patent Document 1 discloses a technique to fold a portion of a flexible substrate included in a display device.

CITATION LIST

Patent Literature

[Patent Document 1] Japanese Unexamined Patent Application Publication No. 2017-187705

SUMMARY

Technical Problem

As to a foldable display device such as the display device disclosed in Patent Document 1, when the display devise is folded, a member on the flexible substrate could develop such a defect as a crack.

Solution to Problem

In order to solve the above problem, a display device according to an aspect of the present disclosure includes: a substrate that is flexible; a protruding portion having a side surface at least partially including a reverse-tapered surface on the substrate; a sealing layer containing a self-repairing material; and a recessed space formed with the side surface of the protruding portion and a surface on which the protruding portion is formed, wherein the sealing layer convers: the side surface and an upper surface of the protruding portion; and a lower surface of the recessed space, and the recessed space has a side surface at least partially including the reverse-tapered surface including reverse-tapered surfaces.

Furthermore, in order to solve the above problem, a method for producing a display device according to another aspect of the present disclosure includes: a protruding portion forming step of forming a protruding portion on a substrate that is flexible to form a recessed space, the protruding portion having a side surface at least partially including a reverse-tapered surface, the recessed space being formed with the side surface of the protruding portion and a surface on which the protruding portion is formed, and the recessed space having a side surface at least partially including the reverse-tapered surface; and a sealing layer forming step of forming a sealing layer covering the side surface and an upper surface of the protruding portion, and a lower surface of the recessed space, the sealing layer containing a self-repairing material.

Advantageous Effect of Invention

Thanks to the present disclosure, a member on a flexible substrate is less likely to develop a defect such as a crack.

In addition, the present disclosure can provide a display device with a function to repair the defect even if the defect has developed.

DESCRIPTION OF EMBODIMENTS

First Embodiment

Overview of Display Device

Figure 2:
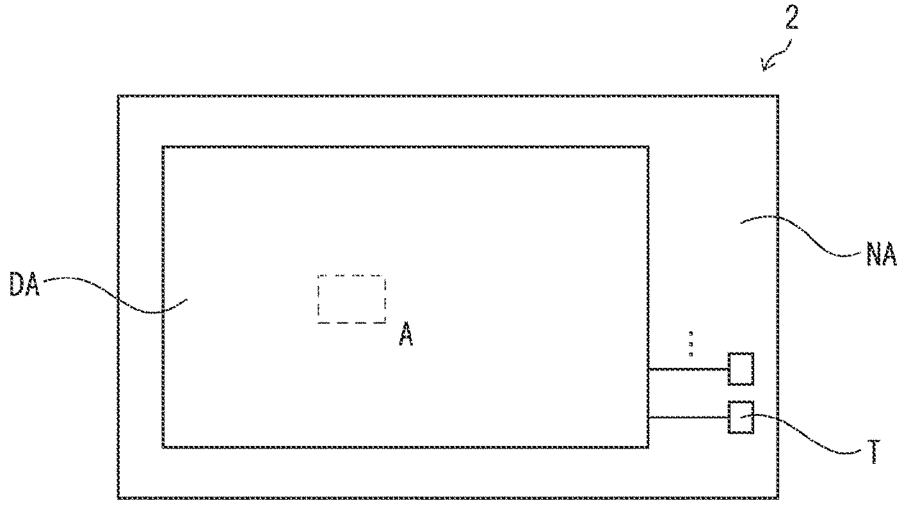
FIG. 2 is a schematic plan view of the display device according to the first embodiment.

FIG. 2 is a schematic plan view of a display device 2 according to this embodiment. As illustrated in FIG. 2, the display device 2 according to this embodiment includes: a display region DA that releases light emitted from subpixels, in order to display an image; and a picture-frame region NA surrounding the display region DA. The subpixels will be described later. The picture-frame region NA includes terminals T formed to receive signals for driving light-emitting elements of the display device 2.

Figure 1:
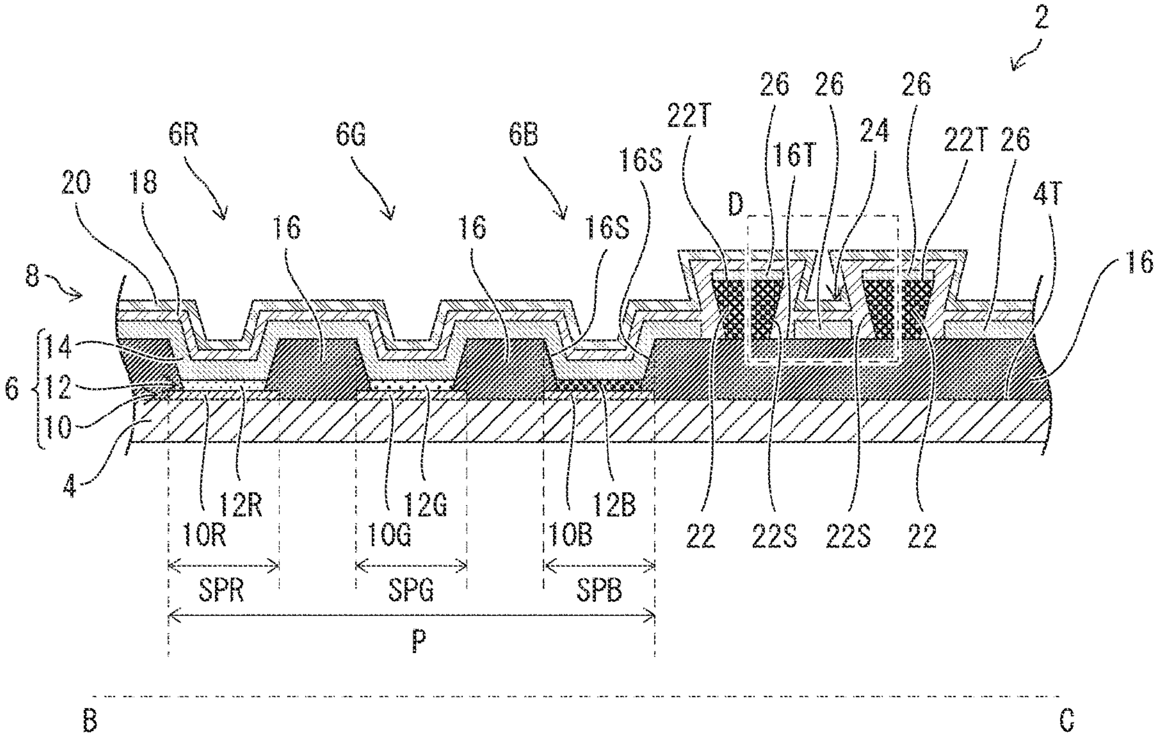
FIG. 1 is a schematic cross-sectional view of a display device according to a first embodiment.
Figure 3:
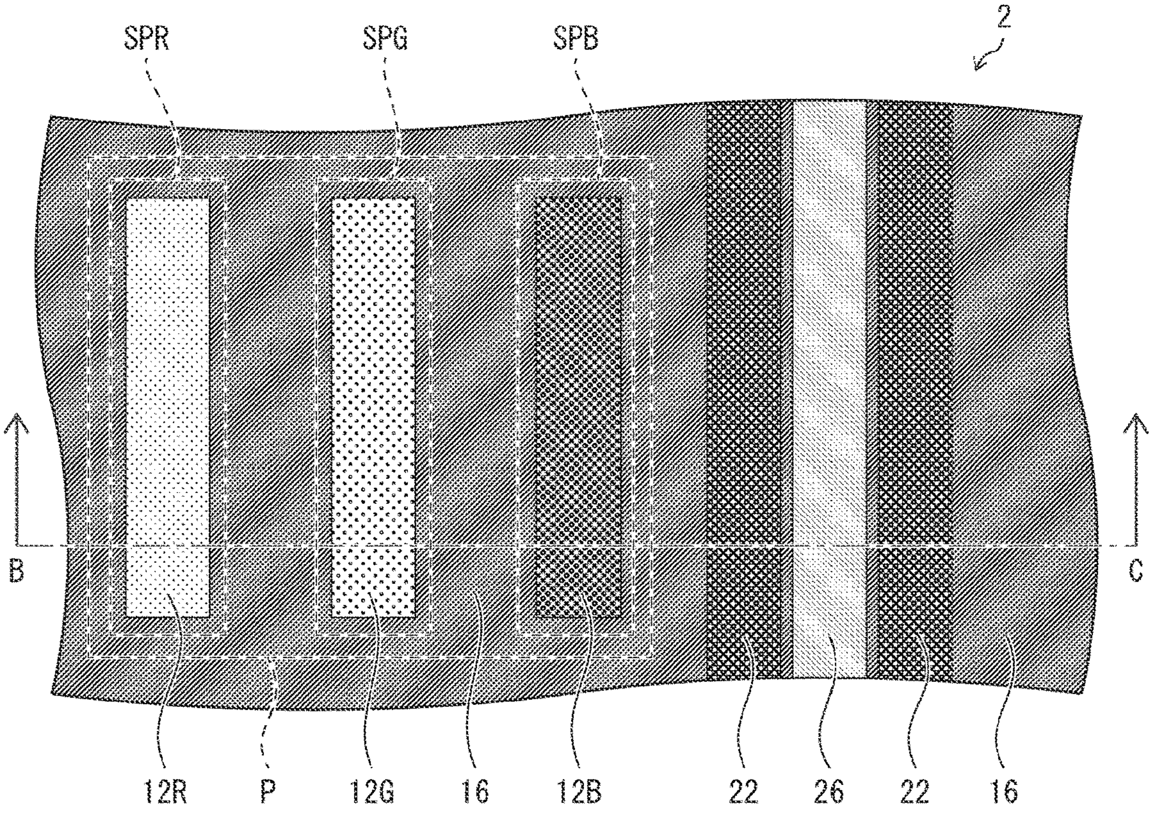
FIG. 3 is an enlarged plan view of the display device according to the first embodiment.

FIG. 3 is an enlarged view of a region A, which is a portion of the display region DA in the schematic plan view illustrated in FIG. 2. FIG. 1 is a schematic cross-sectional view of the display device 2 according to this embodiment, in particular viewed along arrows B-C in FIG. 3. Note that FIG. 3 omits illustrations of a sealing layer 8 and a cathode 14, in order to illustrate pixels and subpixels more clearly. The pixels, the subpixels, the sealing layer 8, and the cathode 14 will be described later in detail. Furthermore, FIG. 3 omits an illustration of a metal layer 26 formed on an upper surface 22T of a protruding portion 22, in order to illustrate more clearly a relationship between the protruding portion 22 and the metal layer 26. The protruding portion 22 and the metal layer 26 will be described later in detail.

The display device 2 according to this embodiment includes a plurality of pixels positioned to overlap with the display region DA in plan view. Furthermore, each of the plurality of pixels includes a plurality of subpixels. The schematic cross-sectional view of the display device 2 in FIG. 1 illustrates a pixel P among the plurality of pixels included in the display device 2. In particular, the pixel P includes: a red subpixel SPR, a green subpixel SPG, and a blue subpixel SPB.

The display device 2 according to this embodiment is a flexible display device including a plurality of light-emitting elements provided on a flexible substrate. For example, as illustrated in FIG. 1, the display device 2 according to this embodiment includes: a substrate 4 that is flexible; a light-emitting element layer 6 on the substrate 4; and the sealing layer 8 that covers the light-emitting element layer 6.

For example, the substrate 4 has a structure including a not-shown thin-film transistor (TFT) formed on a flexible film substrate including a PET film. Furthermore, the light-emitting element layer 6 and the sealing layer 8 formed on the substrate 4 are flexible. Hence, the display device 2 according to this embodiment is a flexible display device foldable with at least one of the substrate 4 or the sealing layer 8 inward.

Note that, in Description, the direction from a light-emitting layer 12 toward an anode 10 of the light-emitting element layer 6 is referred to as a “downward direction”, and the direction from the light-emitting layer 12 toward the cathode 14 of the light-emitting element layer 6 is referred to as an “upward direction” The light-emitting element layer 6 will be described later.

Light-Emitting Element

The light-emitting element layer 6 includes: the anode 10, the light-emitting layer 12 serving as a functional layer; and the cathode 14 in the stated order from toward the substrate 4. In other words, the light-emitting element layer 6 includes the light-emitting layer 12 between two electrodes; namely, the anode 10 and the cathode 14. The anode 10 of the light-emitting element layer 6 formed above the substrate 4 is shaped into an island, provided for each of the subpixels, and electrically connected to a respective TFT of the substrate 4.

In this embodiment, the light-emitting element layer 6 includes a plurality of light-emitting elements. In particular, one light-emitting element is provided for each of the subpixels. In this embodiment, for example, the light-emitting element layer 6 includes, as the light-emitting elements, a red light-emitting element 6R in the red subpixel SPR, a green light-emitting element 6G in the green subpixel SPG, and a blue light-emitting element 6B in the blue subpixel SPB. Hereinafter, in Description, unless otherwise described, the term “light-emitting element” refers to any one of the red light-emitting element 6R, the green light-emitting element 6G, and the blue light-emitting element 6B included in the light-emitting element layer 6.

Here, the anode 10 and the light-emitting layer 12 are formed individually for each of the subpixels. In particular, in this embodiment, the anode 10 includes an anode 10R for the red light-emitting element 6R, an anode 10G for the green light-emitting element 6G, and an anode 10B for the blue light-emitting element 6B. Furthermore, the light-emitting layer 12 includes a red light-emitting layer 12R that emits a red light, a green light-emitting layer 12G that emits a green light, and a blue light-emitting layer 12B that emits a blue light. On the other hand, the cathode 14 is formed in common among the plurality of subpixels.

Hence, in this embodiment, the red light-emitting element 6R includes: the anode 10R; the red light-emitting layer 12R; and the cathode 14. Furthermore, the green light-emitting element 6G includes: the anode 10G; the green light-emitting layer 12G; and the cathode 14. Moreover, the blue light-emitting element 6B includes: the anode 10B; the blue light-emitting layer 12B; and the cathode 14.

Here, the blue light has a center wavelength in a wavelength band of, for example, 400 nm or more and 500 nm or less. Furthermore, the green light has a center wavelength in a wavelength band of, for example, more than 500 nm and 600 nm or less. Moreover, the red light has a center wavelength in a wavelength band of, for example, more than 600 nm and 780 nm or less.

Note that the light-emitting element layer 6 according to this embodiment is not limited to the above configuration, and may further include another layer in addition to the functional layer between the anode 10 and the cathode 14. For example, the light-emitting element layer 6 may further include, in addition to the light-emitting layer 12, at least one of a hole injection layer or a hole transport layer serving as a functional layer between the anode 10 and the light-emitting layer 12. In addition, the light-emitting element layer 6 may further include at least one of an electron transport layer or an electron injection layer between the light-emitting layer 12 and the cathode 14.

The anode 10 and the cathode 14 contain a conductive material, and is electrically connected to the light-emitting layer 12. Of the anode 10 and the cathode 14, the electrode closer to a display surface of the display device 2 is a translucent electrode.

The anode 10 is formed of, for example: an Ag—Pd—Cu alloy; and indium tin oxide (ITO) stacked on the Ag—Pd—Cu alloy. The anode 10 having the above configuration is, for example, a reflective electrode reflective to light emitted from the light-emitting layer 12. Hence, of the light emitted from the light-emitting layer 12, light traveling in the downward direction is reflected off the anode 10.

On the other hand, the cathode 14 is formed of, for example, a translucent Mg—Ag alloy. In other words, the cathode 14 is a transparent electrode transparent to light emitted from the light-emitting layer 12. Hence, of the light emitted from the light-emitting layer 12, light traveling in the upward direction passes through the cathode 14. Thus, the display device 2 can emit the light, from the light-emitting layer 12, in the upward direction.

As described above, the display device 2 can direct both of the lights, the light emitted from the light-emitting layer 12 in the upward direction and the light emitted from the light-emitting layer 12 in the downward direction, toward the cathode 14 (in the upward direction). That is, the display device 2 is a top-emission display device.

Furthermore, in this embodiment, the cathode 14, which is a translucent electrode, partially reflects the light emitted from the light-emitting layer 12. In this case, a cavity for the light emitted from the light-emitting layer 12 may be formed between the anode 10, which is a reflective electrode, and the cathode 14, which is a translucent electrode. The cavity formed between the anode 10 and the cathode 14 can improve chromaticity of the light emitted from the light-emitting layer 12.

Note that the configurations of the anode 10 and the cathode 14 described above are merely examples, and the anode 10 and the cathode 14 may have other configurations. For example, the anode 10 may be an electrode close to the display surface of the display device 2. In this case, the anode 10 may be a translucent electrode, and the cathode 14 may be a reflective electrode. Thanks to such a feature, the display device 2 can direct both of the lights, the light emitted from the light-emitting layer 12 in the upward direction and the light emitted from the light-emitting layer 12 in the downward direction, toward the anode 10 (in the downward direction). That is, the display device 2 may be a bottom-emission display device.

The light-emitting layer 12 emits light by recombination of holes transported from the anode 10 and electrons transported from the cathode 14. The light-emitting layer 12 may contain, for example, an organic light-emitting material or an inorganic light-emitting material. If the light-emitting layer 12 contains an organic light-emitting material, each of the light-emitting elements may be an organic light-emitting diode (OLED) element. Furthermore, if the light-emitting layer 12 contains, for example, an inorganic light-emitting material, the light-emitting layer 12 may contain a quantum dot material as a luminescent material. In this case, each light-emitting element may be a quantum-dot light-emitting diode (QLED) element.

Note that the display device 2 according to this embodiment includes a light-emitting element including the anode 10 provided toward the substrate 4. However, the display device 2 may have any given configuration. For example, the light-emitting element layer 6 included in the display device 2 according to this embodiment may include: the cathode 14; the light-emitting layer 12; and the anode 10, all of which are stacked on top of another in the stated order from toward the substrate 4. In this case, the cathode 14 is a pixel electrode shaped into an island for each of the subpixels, and the anode 10 is a common electrode formed in common among the plurality of subpixels.

The display device 2 according to this embodiment further includes a bank 16 on an upper surface 4T of the substrate 4. The bank 16 contains, for example, an applicable resin material including polyimide. In plan view, each bank 16 is formed in a position across a boundary between adjacent subpixels. Hence, the banks 16 divide the light-emitting element layer 6 into the red light-emitting element 6R, the green light-emitting element 6G, and the blue light-emitting element 6B. In particular, the banks 16 divides the anode 10 into the anode 10R, the anode 10G and the anode 10B. Note that, as illustrated in FIG. 1, the bank 16 may be formed in a position for covering each of the peripheral end portions of the anode 10.

Furthermore, the bank 16 contains an applicable photosensitive resin. In particular, in this embodiment, the bank 16 contains a positive photosensitive resin. Each bank 16 has a side surface 16S. Here, the bank 16 is formed such that an area of the bank 16 in plan view is gradually smaller from toward the substrate 4 to toward the sealing layer 8. Hence, among the directions normal to the side surface 16S, a direction to the inside of the bank 16 is not a planar direction of the upper surface 4T, of the substrate 4, on which the bank 16 is formed, but a direction from the sealing layer 8 toward the substrate 4.

If a specific member has a side surface and the specific member is formed on a specific surface, the angle formed between an outer surface of the side surface and the specific surface is assumed to be an obtuse angle. In this case, in Description, the side surface is referred to as a forward-tapered surface. For example, as to a right square frustrum with the bottom base larger in area than the top base, all of the side surfaces of the right square frustrum are forward-tapered surfaces.

In this embodiment, the bank 16 is formed on the upper surface 4T of the substrate 4. Furthermore, the angle between the upper surface 4T and an outward surface of the side surface 16S of the bank 16 is an obtuse angle. Hence, each side surface 16S of the bank 16 is a forward-tapered surface. Thus, in this embodiment, each of the light-emitting elements is partitioned by the bank 16 whose side surfaces are forward-tapered, and each light-emitting element is formed between the side walls of the forward-tapered surfaces.

Sealing Layer

The sealing layer 8 covers the light-emitting element layer 6 and the bank 16, and seals each of the light-emitting elements included in the display device 2. The sealing layer 8 includes: an inorganic sealing film 18; and an organic sealing film 20 in the stated order from toward the light-emitting element layer 6. The sealing layer 8 reduces penetration of foreign substances such as water from outside the sealing layer 8 of the display device 2 into such layers as the light-emitting element layer 6.

The inorganic sealing film 18 is formed by, for example, the CVD, and made of a silicon oxide film, a silicon nitride film, a silicon oxynitride film, or a multilayer film including these films. The organic sealing film 20 may be formed of, for example, an applicable resin material such as polyimide. Furthermore, the organic sealing film 20 according to this embodiment contains a self-repairing material to be described later in detail. The inorganic sealing film 18 has a thickness of, for example, 1 μm or more and 3 μm or less. The organic sealing film 20 has a thickness of, for example, 1 μm or more and 20 μm or less.

The sealing layer 8 according to this embodiment is not limited to the structure described above. For example, the sealing layer 8 may further include a second inorganic sealing film on the organic sealing film 20. In this case, the organic sealing film 20 also functions as a buffer layer to enhance deposition of the second inorganic sealing film.

Protruding Portion

The display device 2 according to this embodiment further includes a protruding portion 22 between the bank 16 and the sealing layer 8. In particular, the protruding portion 22 according to this embodiment is formed out of the pixel P in plan view. For this reason, the protruding portion 22 is formed on an upper surface 16T of the bank 16 positioned out of the pixel P.

The protruding portion 22 contains, for example, a material that at least partially absorbs or reflects visible light. For example, the protruding portion 22 may contain a black resin material containing carbon particles. Furthermore, the protruding portion 22 contains an applicable photosensitive resin. In particular, in this embodiment, the protruding portion 22 contains a negative photosensitive resin. The protruding portion 22 has a thickness of, for example, 1 μm or more and 5 μm or less, from the upper surface 16T of the bank 16.

Each protruding portion 22 has a side surface 22S. Here, the protruding portion 22 is formed such that an area of the protruding portion 22 in plan view is gradually larger from toward the substrate 4 to toward the sealing layer 8. Hence, among the directions normal to the side surface 22S, a direction to the outside of the protruding portion 22 is not a planar direction of the upper surface 16T, of the bank 16, on which the protruding portion 22 is formed, but a direction from the sealing layer 8 toward the substrate 4.

If a specific member has a side surface and the specific member is formed on a specific surface, the angle formed between an outer surface of the side surface and the specific surface is assumed to be an acute angle. In this case, in Description, the side surface is referred to as a reverse-tapered surface. For example, as to a right square frustrum with the bottom base smaller in area than the top base, all of the side surfaces of the right square frustrum are reverse-tapered surfaces.

In this embodiment, the protruding portion 22 is formed on the upper surface 16T of the bank 16. Furthermore, the angle between the upper surface 16T and an outward surface of the side surface 22S of the protruding portion 22 is an acute angle. Hence, each side surface 22S of the protruding portion 22 is a reverse-tapered surface.

Recessed Space

Figure 4:
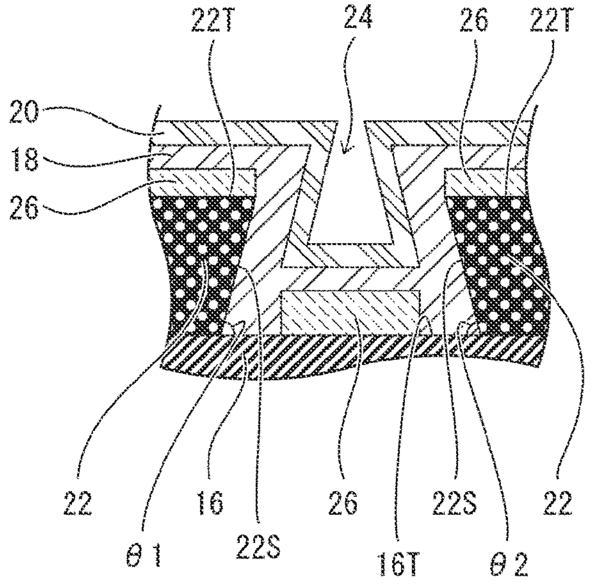
FIG. 4 is a partially enlarged cross-sectional view of the display device according to the first embodiment.

In this embodiment, the protruding portion 22 includes a plurality of protruding portions 22. Hence, between the protruding portions 22, a recessed space 24 is formed with the upper surface 16T of the bank 16 and the side surfaces 22S of the protruding portions 22. On the upper surface 16T, the protruding portions 22 are formed. Described below in more detail is a structure of the recessed space 24, with reference to FIG. 4. FIG. 4 is an enlarged schematic view of the recessed space 24 and the periphery of the recessed space 24. FIG. 4 is a schematic enlarged view of the region D in FIG. 1.

Each of the side surfaces 22S, which is a side surface of the recessed space 24, is a reverse-tapered surface. Hence, in the plan view of the substrate 4, the recessed space 24 is gradually wider from toward the sealing layer 8 to toward the substrate 4. For example, as illustrated in FIG. 4, the recessed space 24 is gradually wider in sectional side view from toward the sealing layer 8 to toward the substrate 4. Furthermore, the display device 2 includes a metal layer 26 on: the upper surface 16T, of the bank 16, positioned inside the recessed space 24; and the upper surfaces 22T of the protruding portions 22. In this embodiment, the metal layer 26 includes a layer of a single metal or layers of multiple metals, or contains an alloy of multiple metals. The metal layer 26 at least partially reflects visible light.

For example, the metal layer 26 contains the same material as that of the cathode 14. In this case, when the cathode 14 is formed, a metal layer containing the material of the cathode 14 is formed entirely over the display region DA of the display device 2. Hence, the metal layer 26 can be formed simultaneously at a step of forming the cathode 14. In this case, the metal layer 26 located inside the recessed space 24 is formed of the metal layer containing the material of the cathode 14. The metal layer is cut stepwise at end portions of the upper surfaces 22T of the protruding portions 22 to form the metal layer 26.

Note that the side surfaces 22S of the protruding portion 22 and the upper surface 16T of the bank 16; that is, side surfaces and a lower surface of the recessed space 24, are covered with the sealing layer 8. In particular, the side surfaces and the lower surface of the recessed space 24 are in contact with the inorganic sealing film 18, and the inorganic scaling film 18 is in contact with the organic sealing film 20 inside the recessed space 24. Hence, inside the recessed space 24, external shapes of the inorganic sealing film 18 and the organic sealing film 20 are recessed in conformity with an internal shape of the recessed space 24.

For example, when the inorganic sealing film 18 is deposited by, for example, the CVD, the material of the inorganic sealing film 18 is delivered to wrap the side surfaces 22S; that is, the side surfaces of the recessed space 24. Thus, the inorganic sealing film 18 can be formed in contact with the side surfaces and the lower surface of the recessed space 24. Furthermore, the organic sealing film 20 in contact with the inorganic sealing film 18 in the recessed space 24 can be formed by applying a material of the organic sealing film 20.

Use of Recessed Space to Reduce Break of Sealing Layer

The recessed space 24, as described above, is gradually wider from toward the sealing layer 8 to toward the substrate 4. Hence, when the display device 2 is folded with the substrate 4 inward, the protruding portions 22 move away from each other at the sealing layer 8. Hence, the recessed space 24 becomes wide. Furthermore, when the display device 2 is folded with the sealing layer 8 inward, the protruding portions 22 move closer to each other at the sealing layer 8. Hence, the recessed space 24 becomes narrow.

Thus, when the display device 2 is folded, stress develops in each of the layers including the light-emitting element layer 6 and the sealing layer 8 of the display device 2. The stress is dispersed as force to move the protruding portions 22 around the recessed space 24. Therefore, in the display device 2, the recessed space 24 reduces the stress generated in each of the layers including the light-emitting element layer 6 and the sealing layer 8 on the substrate 4, thereby reducing generation of defects such as breaks of the layers.

Furthermore, when the display device 2 is folded, the motion of the protruding portions 22 develop stress in the sealing layer 8. The stress is concentrated inside the recessed space 24. Hence, even if the sealing layer 8 is broken when the display device 2 is folded, the break is concentrated inside the recessed space 24. Therefore, defects including the break of the scaling layer 8 are concentrated inside the recessed space 24 positioned out of each pixel. Such a feature keeps the defects from affecting presentation of an image by the display device 2.

Note that, in this embodiment, the protruding portions 22 are formed out of the pixel P in plan view. In other words, each of the light-emitting elements according to this embodiment is formed between the banks 16 whose side surfaces are forward-tapered.

Here, suppose the display device 2 according to this embodiment is a top-emission display device that releases light from each of the light-emitting elements not toward the substrate 4 but toward the sealing layer 8. In this case, a space between the banks 16 to form the light-emitting element is larger in plan view toward the sealing layer 8 than toward the substrate 4. Hence, if the display device 2 according to this embodiment is a top-emission display device, the banks 16 are less likely to block light from the light-emitting layers 12. Such a feature reduces a decrease in efficiency of releasing light from each of the light-emitting elements.

In this embodiment, the angles formed between: the side surfaces 22S of the protruding portions 22; that is, the side surfaces of the recessed space 24; and the upper surface 16T of the bank 16; that is, the lower surface of the recessed space 24, may be equivalent in at least one recessed space 24. Specifically, as illustrated in FIG. 4, a first angle θ1 is formed between the side surface 22S of the protruding portion 22 on the left to FIG. 4 and the upper surface 16T of the bank 16 may be equivalent to a second angle θ2 formed between the side surface 22S of the protruding portion 22 on the right to FIG. 4 and the upper surface 16T of the bank 16.

Note that, in Description, the statement "the two angles are equivalent" does not mean that the angles are exactly the same. The angles may be slightly different from each other. For example, different protruding portions 22 are produced of the same material under the same production condition, and each of the different protruding portions 22 forms an angle with the upper surface 16T of the bank 16. If a difference between the angles is as small as an error made during the production process of the protruding portions 22, the angles may be interpreted as the same angle.

Self-Repairing Material

Figure 5:
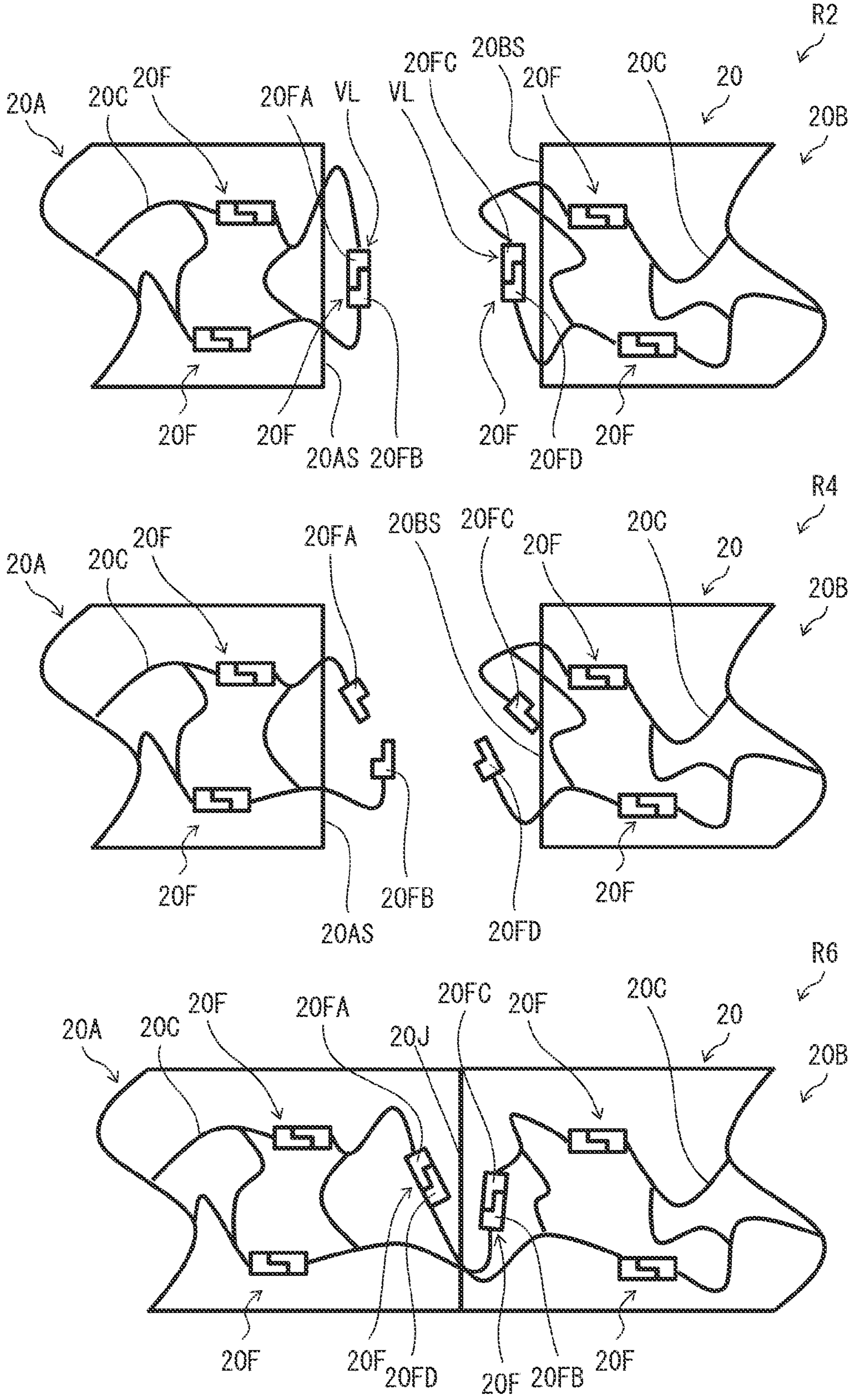
FIG. 5 illustrates cross-sectional views of steps as to a mechanism of repairing an organic sealing layer, using a self-repairing material according to the first embodiment.

Described next in more detail with reference to FIG. 5 is a self-repairing material contained in the organic sealing film 20 according to this embodiment. FIG. 5 illustrates cross-sectional views of steps as to a mechanism of repairing the broken organic sealing film 20, using the self-repairing material contained in the organic sealing film 20. In FIG. 5, the organic sealing film 20 is assumed to be broken into, for example, a first organic sealing film 20A and a second organic sealing film 20B inside the recessed space 24.

FIG. 5 shows that the first organic sealing film 20A and the second organic sealing film 20B contain a photosensitive polymer serving as a self-repairing material. The photosensitive polymer includes, for example: a plurality of bonding portions 20F each formed of two photosensitive bonding groups bonding to each other; and a bonding chain 20C connecting the bonding portions 20F together.

The two photosensitive bonding groups included in each of the bonding portions 20F are irradiated with visible light and radicalized, such that the bond of the two photosensitive boding groups is broken. Whereas, the photosensitive bonding groups included in the bonding portion 20F come close to, and recombine with, other photosensitive bonding groups. The recombination of the two photosensitive bonding groups also occurs between photosensitive bonding groups other than the two photosensitive bonding groups included in the original bonding portion 20F.

For example, the first organic sealing film 20A includes: a first photosensitive boding group 20FA; and a second photosensitive boding group 20FB, both of which are exposed from a first broken surface 20AS formed when the first organic sealing film 20A is broken away from the second organic sealing film 20B. When the first photosensitive bonding group 20FA and the second photosensitive bonding group 20FB bond together, the bonding portion 20F is formed and exposed from the first broken surface 20AS. Furthermore, the second organic scaling film 20B includes: a third photosensitive boding group 20FC; and a fourth photosensitive boding group 20FD, both of which are exposed from a second broken surface 20BS formed when the second organic sealing film 20B is broken away from the first organic sealing film 20A. When the third photosensitive bonding group 20FC and the fourth photosensitive bonding group 20FD bond together, the bonding portion 20F is formed and exposed from the second broken surface 20BS.

At a step of repairing the break between the first organic sealing film 20A and the second organic sealing film 20B, as illustrated in a reaction process R2 of FIG. 5, the bonding portion 20F exposed from the first broken surface 20AS and the bonding portion 20F exposed from the second broken surface 20BS are irradiated with visible light VL. Actually, the visible light VL may be external light from the outside of the display device 2.

The photosensitive bonding groups included in the bonding portions 20F irradiated with the visible light VL break their bond by radical reaction. Therefore, as illustrated in a reaction process R4 of FIG. 5, the bonding portion 20F exposed from the first broken surface 20AS is broken into the first photosensitive bonding group 20FA and the second photosensitive bonding group 20FB. Furthermore, the bonding portion 20F exposed from the second broken surface 20BS is broken into the third photosensitive bonding group 20FC and the fourth photosensitive bonding group 20FD.

Hence, each of the first photosensitive bonding group 20FA and the second photosensitive bonding group 20FB becomes a broken end of the bonding portion 20F exposed from the first broken surface 20AS. Furthermore, each of the third photosensitive bonding group 20FC and the fourth photosensitive bonding group 20FD becomes a broken end of the bonding portion 20F exposed from the second broken surface 20BS.

Next, for example, suppose the display device 2 folded with the substrate 4 inward is brought back to the original state of a substantially flat plate shape, such that the first broken surface 20AS and the second broken surface 20BS come into contact with each other and form a joint portion 20J. In this case, for example, as illustrated in a reaction process R6 of FIG. 5, the first photosensitive bonding group 20FA and the fourth photosensitive bonding group 20FD might come close to, and recombine with, each other. Furthermore, for example, as illustrated in the reaction process R6 of FIG. 5, the second photosensitive bonding group 20FB and the third photosensitive bonding group 20FC might come close to, and recombine with, each other.

In this case, as illustrated in the reaction process R6 of FIG. 5, the first photosensitive bonding group 20FA and the fourth photosensitive bonding group 20FD bond together to form the bonding portion 20F. At least one of the bonding chains 20C connected to the bonding portion 20F crosses over the joint portion 20J. Furthermore, as illustrated in the reaction process R6 of FIG. 5, the second photosensitive bonding group 20FB and the third photosensitive bonding group 20FC bond together to form the bonding portion 20F. At least one of the bonding chains 20C connected to the bonding portion 20F crosses over the joint portion 20J.

As described above, the bonding chain 20C crossing over the joint portion 20J bonds the first organic sealing film 20A and the second organic sealing film 20B together. Hence, using the self-repairing material included in the organic sealing film 20, the break between the first organic sealing film 20A and the second organic sealing film 20B is self-repaired.

Note that if the angles formed between the side surfaces 22S of the protruding portion 22 and the upper surface 16T of the bank 16 are equivalent in a certain recessed space 24, the stress generated in the organic sealing film 20 included inside the recessed space 24 is concentrated on a center portion of the recessed space 24. Thus, the break of the organic sealing film 20 included inside the recessed space 24 is also concentrated on the center portion of the recessed space 24. Therefore, the above feature can repair the break of the organic sealing film 20 more efficiently.

The self-repairing material to achieve the mechanism of repairing the organic sealing film 20 described above may be, for example, polyurethane represented by a chemical formula below and having a thiuram group as a photosensitive bonding group.

[Chemical 1]

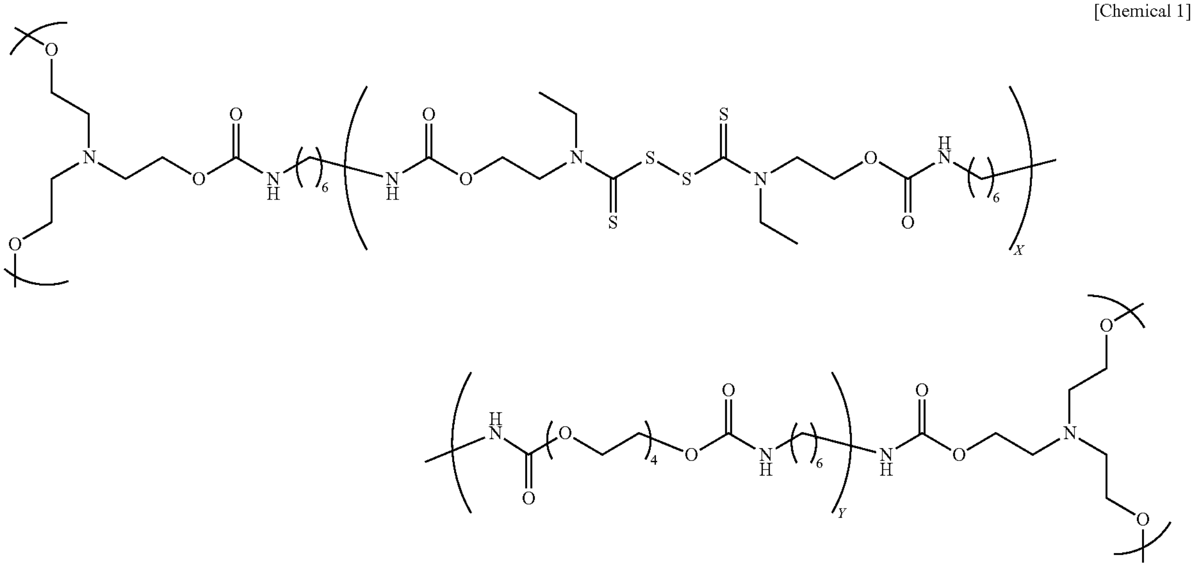

Alternatively, the self-repairing material to achieve the mechanism of repairing the organic sealing film 20 may be, for example, polystyrene represented by a chemical formula below and having a diselenide group as a photosensitive bonding group.

[Chemical 2]

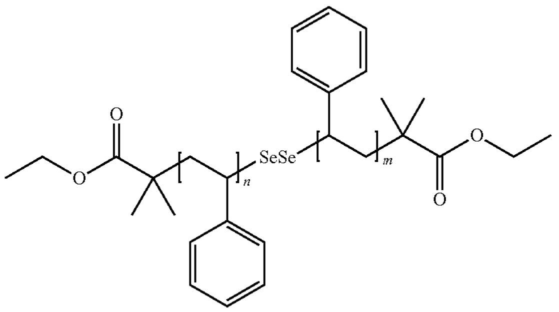

The above-described mechanism of repairing the organic sealing film 20 is achieved when the broken surfaces of the first organic sealing film 20A and the second organic sealing film 20B are irradiated with visible light and come into contact with each other. Hence, for example, the organic sealing film 20 spontaneously repairs itself with the self-repairing material during a process in which the display device 2 bends and returns to the original state.

Furthermore, the repair process using the self-repairing material is reversible. Hence, even if the organic sealing film 20 develops multiple defects such as cracks, the self-repairing is carried out each time a defect appears, using the self-repairing material contained in the organic sealing film 20. Therefore, the self-repairing material described above can repair defects of the organic sealing film 20 more efficiently.

In this embodiment, as described above, the organic sealing film 20 is more likely to be broken inside the recessed space 24. Here, the recessed space 24 includes the metal layer 26 on the lower surface of the recessed space 24. The metal layer 26 at least partially reflects visible light. Hence, if the organic sealing film 20 develops a break inside the recessed space 24, the broken surface formed by the break is highly likely to be irradiated with the visible light reflected on the metal layer 26. Therefore, the metal layer 26 according to this embodiment allows for a more efficient repair of the break developed on the organic sealing film 20 inside the recessed space 24.

The side surfaces 22S of the protruding portions 22; that is, the side surfaces of the recessed space 24, may at least partially reflect or scatter visible light. In this case, the visible light reflected or scattered on the side surfaces 22S of the protruding portions 22 is highly likely to be emitted to the organic sealing film 20 provided inside the recessed space 24. Therefore, the protruding portions 22 according to this embodiment allow for a more efficient repair of the break developed on the organic sealing film 20 inside the recessed space 24.

Outline of Method for Producing Display Device

Figure 6:
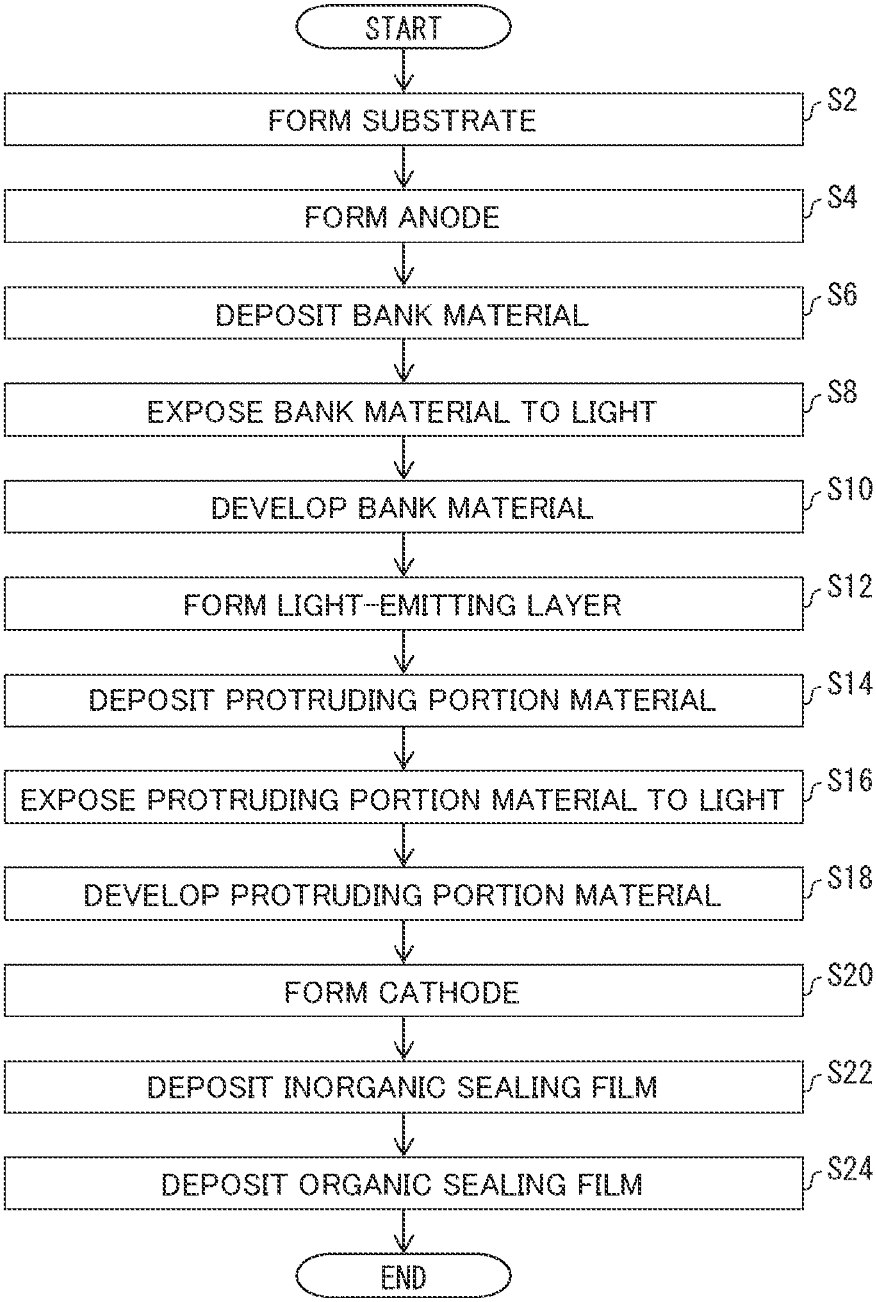
FIG. 6 is a flowchart showing a method for producing the display device according to the first embodiment.
Figure 7:
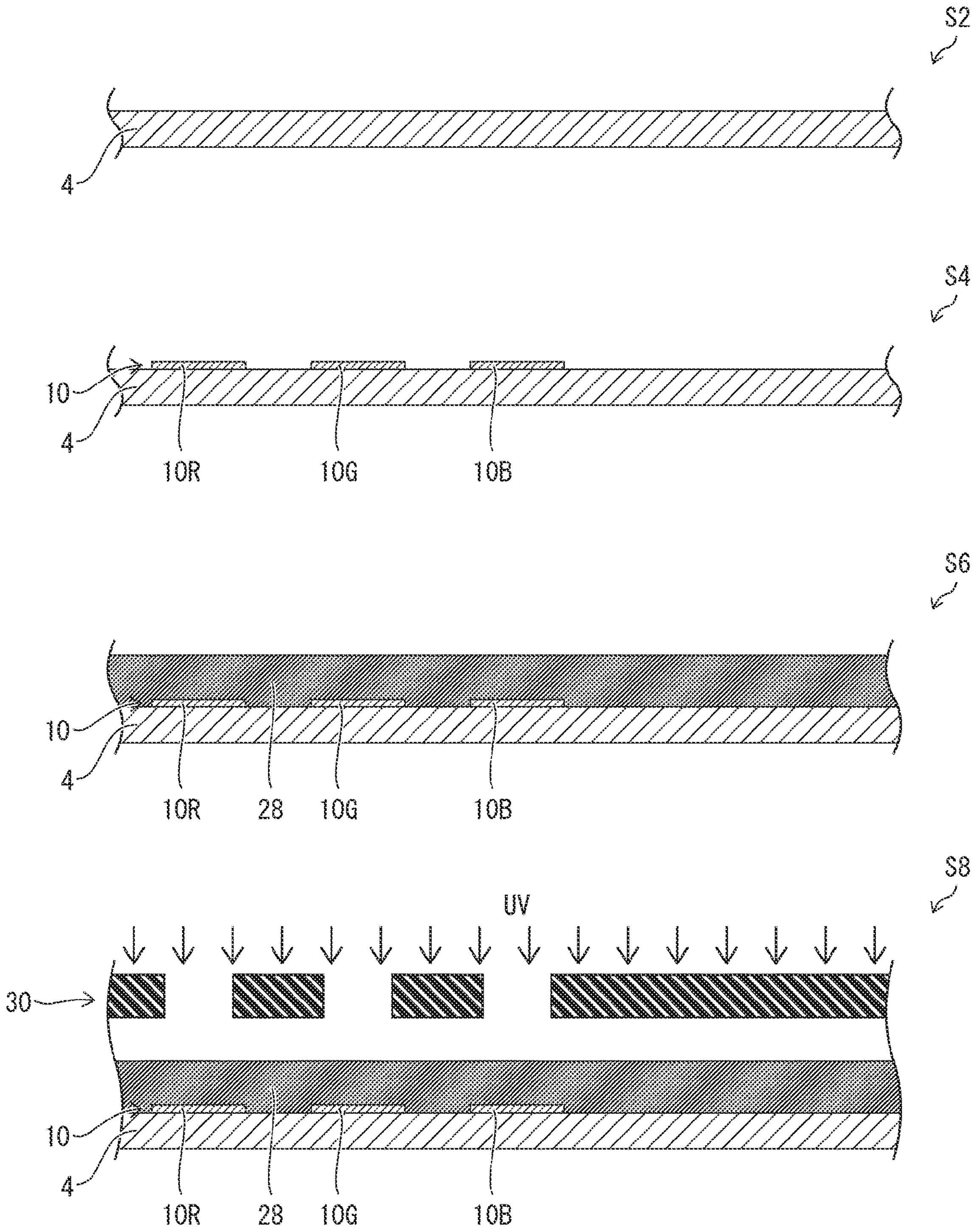
FIG. 7 illustrates cross-sectional views of steps included in the steps of producing the display device according to the first embodiment.
Figure 8:
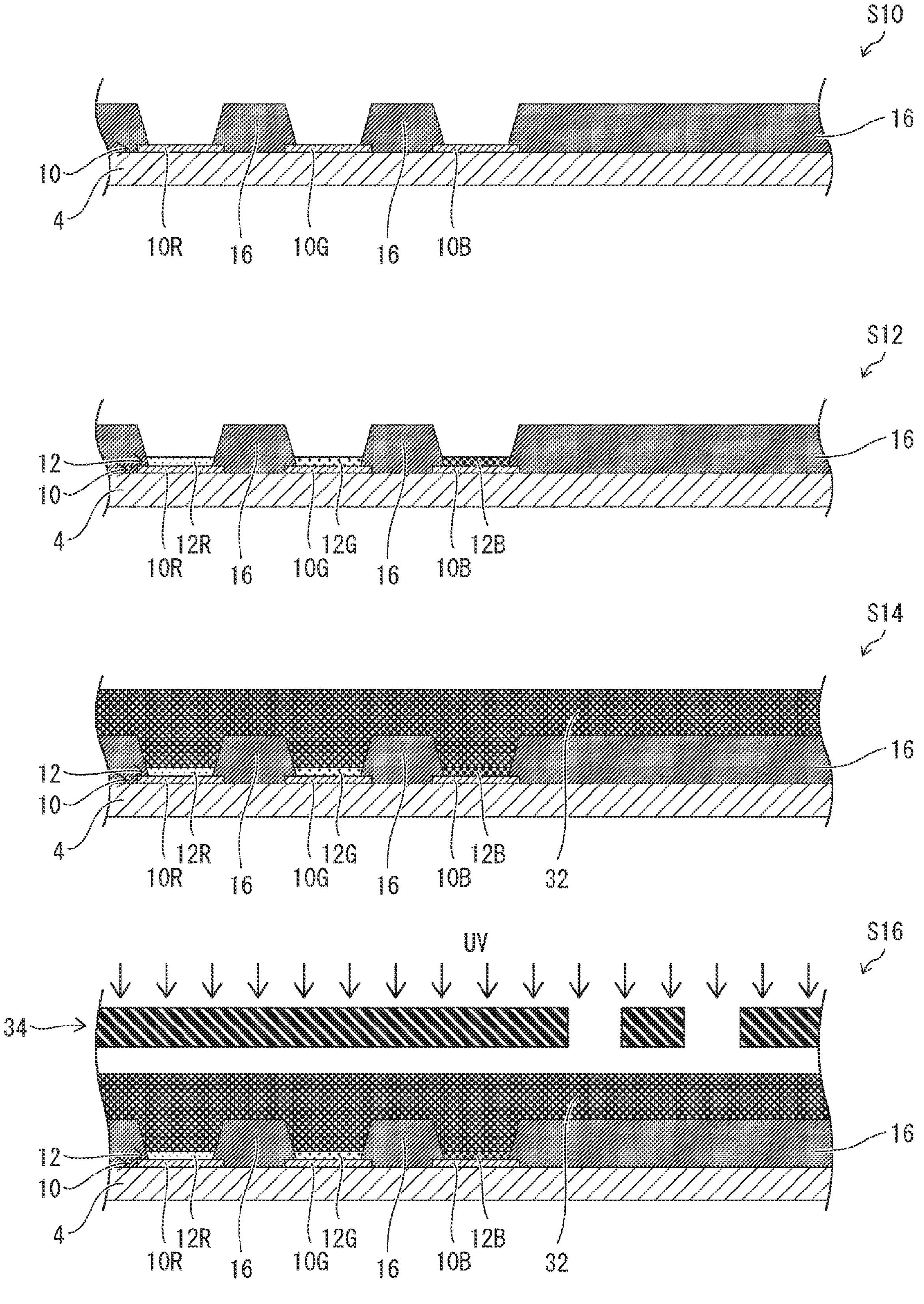
FIG. 8 illustrates cross-sectional views of other steps included in the steps of producing the display device according to the first embodiment.
Figure 9:
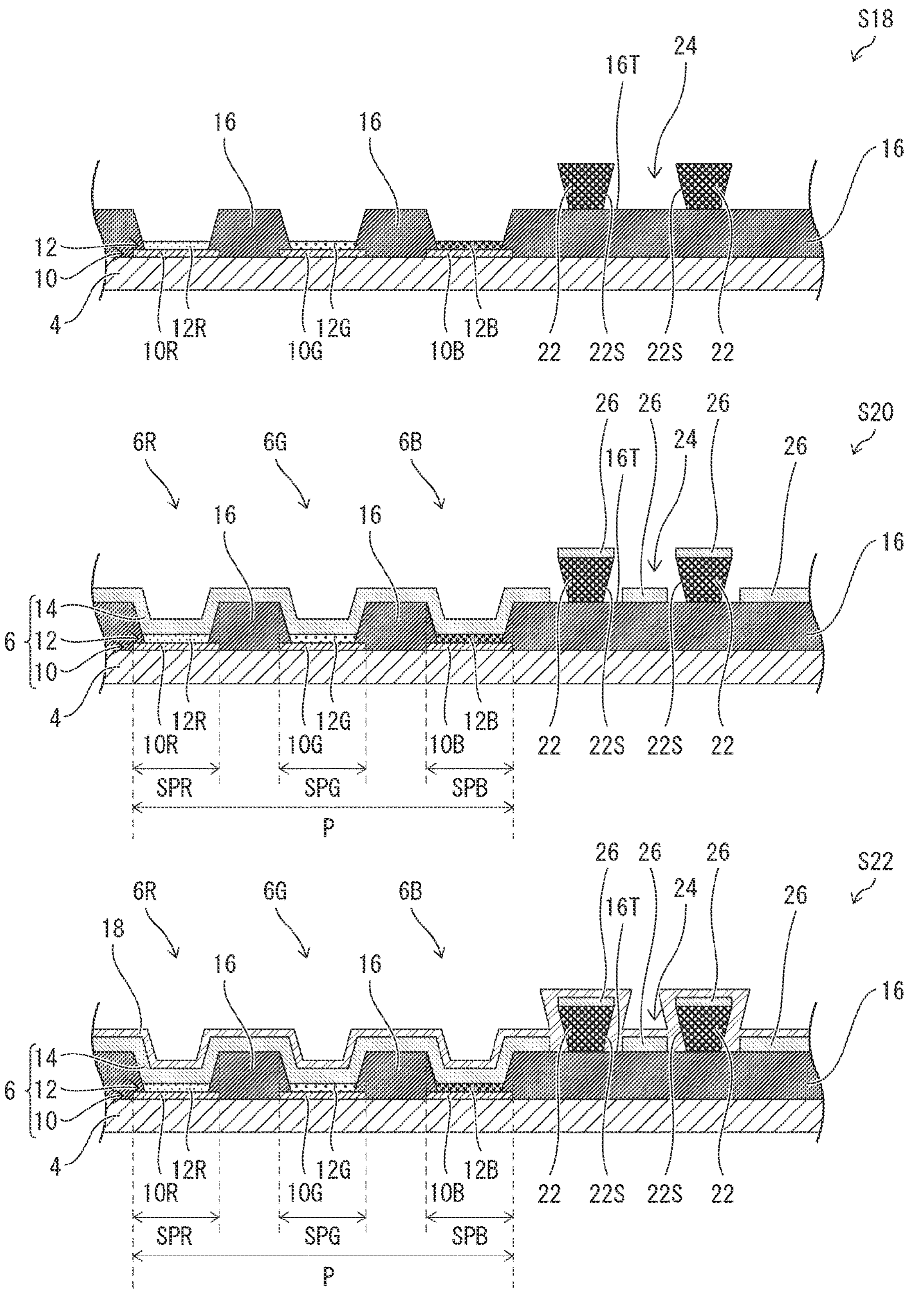
FIG. 9 illustrates cross-sectional views of yet other steps included in the steps of producing the display device according to the first embodiment.

Described next is a method for producing the display device 2 according to this embodiment, with reference to FIGS. 6 to 9. FIG. 6 is a flowchart showing the method for producing the display device 2 according to this embodiment. FIGS. 7 to 9 illustrate cross-sectional views of the display device 2. Each of the cross-sectional views illustrates a step shown in the flowchart of FIG. 6. Each of FIGS. 7 to 9 illustrates cross-sections corresponding to the cross-section of the display device 2 illustrated in FIG. 1.

In the method for producing the display device 2 according to this embodiment, first, the substrate 4 is formed (Step S2). The substrate 4 is formed of, for example, a flexible film substrate on which a TFT is formed for each of the subpixels. Note that, at Step S2, the substrate 4 does not have to be completely formed. For example, first, TFTs may be formed on a hard glass substrate. After that, as a formation method to be described later proceeds, the light-emitting element layer 6 and the sealing layer 8 may be formed on the glass substrate. After that, the glass substrate may be removed and a film substrate is attached. Thus, the substrate 4 may be formed.

Next, the anode 10 is formed (Step S4). The anode 10 may be formed of, for example, a conductive material deposited in common among the subpixels by such a technique as sputtering. After that, a thin film of the conductive material may be patterned for each of the subpixels to form the anode 10. At Step S4 according to this embodiment, the anode 10R, the anode 10G, and the anode 10B are formed in respective positions of the red subpixel SPR, the green subpixel SPG, and the blue subpixel SPB.

Forming Bank

Next, a step of forming banks 16 is carried out. At the step of forming the banks 16, first, a bank material 28 containing a positive photosensitive resin is applied to upper surfaces of the substrate 4 and the anodes 10 (Step S6). The bank material 28 may be applied by such an application technique as application with a coater, or application by spin-coating.

Next, a light exposure step is carried out, so that the applied bank material 28 is irradiated with light (Step S8). At Step S8, first, a photomask 30 is provided above the applied bank material 28, across from the substrate 4. The photomask 30 includes: blocking portions that block ultraviolet rays; and transmitting portions that transmit the ultraviolet rays. Here, the photomask 30 includes the transmitting portions positioned to overlap in plan view with the respective subpixels including the respective anodes 10. For example, the photomask 30 may be a film member having openings positioned to overlap with the respective subpixels, and blocking the ultraviolet rays. The photomask 30 is provided, for example, in parallel with the upper surface of the substrate 4.

The photomask 30 is provided above the bank material 28. After that, ultraviolet rays UV are emitted from further above the photomask 30 provided above the bank material 28. Here, the ultraviolet rays UV are emitted in a direction parallel with a direction substantially normal to each of the photomask 30 and the upper surface of the substrate 4. Therefore, the ultraviolet rays UV are emitted to the bank material 28 found only in the positions overlapping in plan view with the transmission portions of the photomask 30.

Next, the bank material 28 exposed to light is developed (Step S10) to form the banks 16. The bank material 28 contains a positive photosensitive resin. Of the bank material 28, portions irradiated with ultraviolet rays UV become soluble in a developing solution. Hence, the bank material 28 exposed to light is washed with the developing solution. The solution removes the bank material 28 formed only in positions overlapping in plan view with the respective anodes 10. The remaining bank material 28 becomes the banks 16.

Here, typically, light passing through an opening of the photomask is scattered at an end portion of the opening. Hence, in the vicinity of the photomask, the light passing through the opening of the photomask is emitted, slightly diffusing around the opening in plan view. Here, the light is emitted to an object through the photomask. In a place, on the object, close to the opening of the photomask, the light is emitted more intensely to a place slightly larger in plan view than the opening.

In other words, when the light passing through an opening is emitted to a specific object, the area irradiated with the light is narrower as a distance between the opening and the object is longer. Accordingly, the intensity of the emitted light tends to decrease. Hence, at Step S8, in plan view, when an ultraviolet ray UV passing through the transmission portion of the photomask 30 is emitted to the bank material 28, the area of the bank material 28 irradiated with the ultraviolet ray UV is gradually narrower downwards of the photomask 30. Furthermore, the exposure intensity of the ultraviolet ray UV emitted to the bank material 28 is gradually lower downwards of the photomask 30.

Hence, the portion, of the bank material 28, irradiated with the ultraviolet ray UV becomes smaller from toward the photomask 30 to toward the substrate 4. Furthermore, the exposure intensity observed at the portion of the bank material 28 becomes lower from toward the photomask 30 to toward the substrate 4. Hence, at Step S10, when the portion irradiated with the ultraviolet ray UV is removed with the developing solution, the remaining banks 16 are gradually larger from the upper surface 16T toward the substrate 4. In view of the above circumstances, the bank material 28 containing a positive photosensitive material can form the banks 16 each having forward-tapered side surfaces.

Note that when the bank material 28 is washed with the developing solution, the bank material 28 not exposed to light may be dissolved in small amount into the developing solution. In this case, the bank material 28 becomes thin, and so do the banks 16. Hence, the thickness of the bank material 28 to be applied may be determined, taking reduction in thickness of the banks 16 into consideration.

Next, the light-emitting layers 12 are formed in positions to overlap with the respective anodes 10 exposed from the banks 16 (Step S12). In forming the light-emitting layers 12, light-emitting materials of the red light-emitting layer 12R, the green light-emitting material 12G, and the blue light-emitting layer 12B may be evaporated using a metal mask. Alternatively, in forming the light-emitting layers 12, the light-emitting materials of the light-emitting layers may be deposited into layers and patterned repeatedly for the respective colors.

Forming Protruding Portions

Next, a step of forming the protruding portions 22 is carried out. At the step of forming the protruding portions 22, first, a protruding portion material 32 containing a negative photosensitive resin is applied to the upper surfaces of the substrate 4 and the anodes 10 (Step S14). The protruding portion material 32 may be applied by the same technique as that for the bank material 28.

Next, a light exposure step is carried out, so that the applied protruding portion material 32 is irradiated with light (Step S16). At Step S16, first, a photomask 34 is provided above the applied protruding portion material 32, across from the substrate 4. The photomask 34 may have the same configuration as that of the photomask 30, except for, for example, the positions of the transmission portions. For example, the photomask 34 includes transmission portions in positions overlapping in plan view with a bank 16 positioned out of the pixel P. The photomask 34 is provided, for example, in parallel with the upper surface 16T of the bank 16.

The photomask 34 is provided above the protruding portion material 32. After that, ultraviolet rays UV are emitted from further above the photomask 34 provided above the protruding portion material 32. Here, the ultraviolet rays UV are emitted in a direction parallel with a direction substantially normal to each of the photomask 34 and the upper surface of the substrate 4. Therefore, the ultraviolet rays UV are emitted to the protruding portion material 32 found only in the positions overlapping in plan view with the transmission portions of the photomask 34.

Next, the protruding portion material 32 exposed to light is developed (Step S18) to form the protruding portions 22. The protruding portion material 32 contains a negative photosensitive resin. Of the protruding portion material 32, a portion irradiated with ultraviolet rays UV becomes insoluble in a developing solution. Hence, the protruding portion material 32 exposed to light is washed with the developing solution. The only remaining portion formed of the protruding portion material 32 is positioned to overlap in plan view with the bank 16 positioned out of the pixel P. The remaining protruding portion material 32 becomes the protruding portions 22.

Because of the same reason described above, also at Step S16, in plan view, when an ultraviolet ray UV passing through the transmission portion of the photomask 34 is emitted to the protruding portion material 32, the area of the protruding portion material 32 irradiated with the ultraviolet ray UV is gradually narrower downwards of the photomask 34. Accordingly, the intensity of emitted light decreases. Hence, the portion, of the protruding portion material 32, irradiated with the ultraviolet ray UV becomes smaller from toward the photomask 34 to toward the substrate 4. Furthermore, the exposure intensity observed at the portion of the protruding portion material 32 becomes lower from toward the photomask 34 to toward the substrate 4.

Hence, at Step S18, the remaining protruding portions 22 are irradiated with the ultraviolet ray UV. Thus, the protruding portions 22 are gradually smaller from the upper surfaces 22T toward the upper surface 16T of the bank 16. In view of the above circumstances, the protruding portion material 32 containing a negative photosensitive material can form the protruding portions 22 each having reverse-tapered side surfaces 22S.

Thus, along with the formation of the protruding portions 22, the recessed space 24 is formed with the bank 16 and the protruding portions 22. The recessed space 24 is formed at least partially with the side surfaces 22S that are reverse-tapered, and with the upper surface 16T of the bank 16 as the lower surface. Because the protruding portion material 32 is a negative photosensitive resin, the side surfaces 22S of the protruding portions 22 can be formed reverse-tapered, using a typical photolithography technique for the protruding portion material 32. Hence, the method for producing the display device 2 according to this embodiment eliminates the need for a specific operation to form the reverse-tapered side surfaces 22S of the protruding portions 22. Such a feature simplifies the production steps.

Furthermore, in the method for producing the display device 2 according to this embodiment, the protruding portions 22 are formed on the bank 16. Hence, even if the protruding portions 22 are more or less misaligned when formed, the misalignment is less likely to affect presentation of an image by the display device 2. Specifically, at the step of forming the protruding portions 22, the protruding portions 22 do not have to be aligned as precisely as the banks 16 at the step of forming the banks 16. Therefore, the method for producing the display device 2 according to this embodiment simplifies the step of forming the protruding portions 22.

Forming Cathode and Sealing Layer

Next, the cathode 14 is formed (Step S20). The cathode 14 can be formed of, for example, a thin metal film deposited by sputtering or evaporation on the entire surface of the display region DA including the pixel P. Here, the thin metal film is deposited also in a position overlapping in plan view with the bank 16 on which the protruding portions 22 are formed. Hence, together with the cathode 14, the metal layer 26 is formed to be positioned: on the upper surfaces 22T of the protruding portions 22; and inside the recessed space 24.

Thus, the anode 10, the light-emitting layer 12, and the cathode 14 are formed, and the light-emitting element layer 6 is completely formed. Accordingly, each of the red light-emitting element 6R, the green light-emitting element 6G, and the blue light-emitting element 6B is formed in a position corresponding to one of the red subpixel SPR, the green subpixel SPG, and the blue subpixel SPB.

Next, a thin film of an inorganic material is deposited by, for example, the CVD over the cathode 14 across from the substrate 4. Thus, the inorganic sealing film 18 is formed (Step S22). Here, when the inorganic sealing film 18 is deposited, the thin film of the inorganic material is delivered to wrap the side surfaces 22S of the protruding portions 22 and the upper surface 16T of the bank 16, including the side surfaces and the bottom surface of the recessed space 24. Hence, at Step S22, the inorganic sealing film 18 is formed to cover the side surfaces and the lower surface of the recessed space 24.

Next, an organic material containing a self-repairing material is applied with a coater or by spin coating from above the inorganic sealing film 18 across from the substrate 4. Thus, the organic sealing film 20 is formed (Step S24). The organic sealing film 20 is formed by application, and readily covers the side surfaces and the lower surface of the recessed space 24. This is how the display device 2 illustrated in FIG. 1 is produced.

Note that, in the method for producing the display device 2 according to this embodiment, exemplified is a case where the bank forming step is formed, and after that, the light-emitting layer forming step and the protruding portion forming step are carried out in the stated order. However, the method for producing the display device 2 shall not be limited to such an example. In the method, the bank forming step is carried out, and after that, the protruding portion forming step and the light-emitting layer forming step may be carried out in the stated order.

In this case, before the formation of the light-emitting layer 12, the protruding portion material 32 can be exposed to light and developed at the protruding portion forming step. Hence, the producing method can prevent damage to the light-emitting layer 12 when the protruding portion material 32 is exposed to light and developed at the protruding portion forming step.

Summary of, and Supplement to, First Embodiment

The display device 2 according to this embodiment includes the recessed space 24 formed with the protruding portions 22 positioned on the upper surface 16T of the bank 16. Thus, as to the display device 2 according to this embodiment, the recessed space 24 can alleviate stress generated in each of the members on the substrate 4 when the substrate 4 is bent, thereby reducing development of defects in each of the light-emitting elements.

Furthermore, in the display device 2 according to this embodiment, the sealing layer 8 including the organic sealing film 20 having the self-repairing material covers the upper surfaces 22T of the protruding portions 22 and the side surface and the lower surface of the recessed space 24 formed with the protruding portions 22. Therefore, the display device 2 according to this embodiment repairs by itself defects including a crack developed in the organic sealing film 20 inside the recessed space 24, and keeps foreign substances including water from entering the sealing layer 8 and each of the constituent features below the scaling layer 8.

The display device 2 according to this embodiment includes the protruding portions 22 on the upper surface of the bank 16 defining the light-emitting elements. Thanks to the such a configuration, the recessed space 24 formed with the protruding portions 22 is not adjacent to the light-emitting elements. Hence, such a feature more efficiently keeps foreign substances including water from entering the light-emitting elements even if defects including a crack in the organic sealing film 20 develop in the recessed space 24.

Second Embodiment

Figure 10:
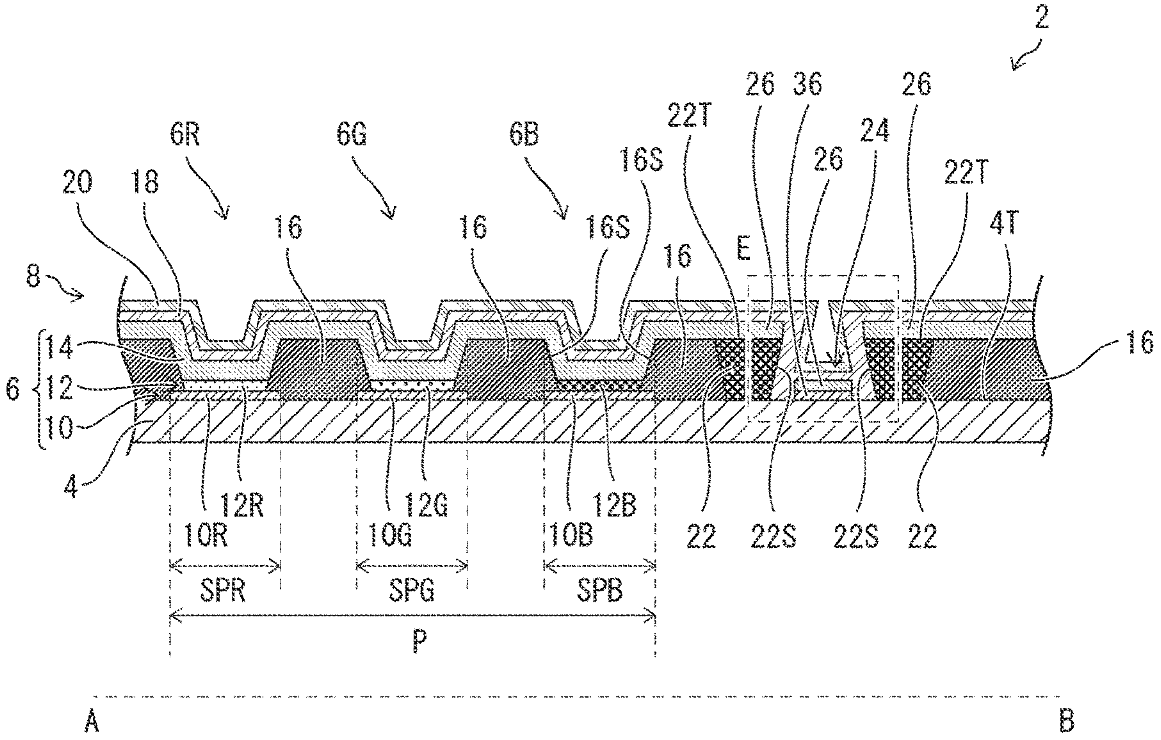
FIG. 10 is a schematic cross-sectional view of the display device according to a second embodiment.
Figure 11:
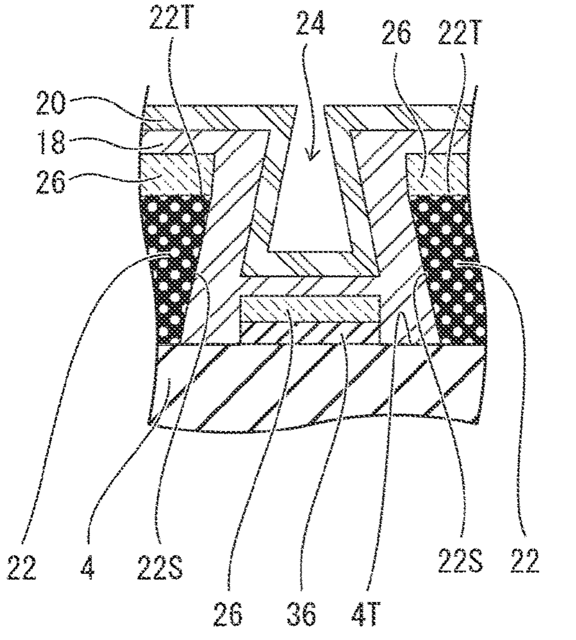
FIG. 11 is a partially enlarged cross-sectional view of the display device according to the second embodiment.

Modified Example of Where to Form Protruding Portions and Modification of Metal Layer FIG. 10 is a cross-sectional view of a side of the display device 2 according to this embodiment. The cross-section corresponds to the cross-section illustrated in FIG. 1. FIG. 11 is an enlarged schematic view of, and around, the recessed space 24 according to this embodiment, illustrating a region E in FIG. 10. Note that, like names and reference signs designate members with identical or corresponding functions throughout Description. Such members shall not be elaborated upon repeatedly unless otherwise different in configuration.

Compared with the display device 2 according to the previous embodiment, the display device 2 according to this embodiment has the protruding portions 22 provided on an upper surface 4T of the substrate 4 instead of the upper surface 16T of the bank 16. Accordingly, on the outside of the pixel P in plan view of the display device 2, there is a place in which the bank 16 is partially missing. In a portion of the place, the protruding portions 22 are formed. Hence, the display device 2 according to this embodiment can be interpreted as the display device 2, according to the previous embodiment, in which the bank 16 positioned out of the pixel Pin plan view is replaced with the protruding portions 22.

As illustrated in FIG. 10, each of the protruding portions 22 may be formed so that, for example, a side surface 22S facing the bank 16 is in contact with a side surface of the bank 16. Furthermore, each protruding portion 22 may be, for example, substantially the same in thickness as the bank 16 in contact with the protruding portion 22.

Thanks to such a configuration, the recessed space 24 formed between the protruding portions 22 has: side surfaces including the side surfaces 22S of the protruding portions 22; and a lower face including the upper surface 4T, of the substrate 4, on which the protruding portions 22 are formed. In other words, the recessed space 24 according to this embodiment is formed on the upper surface 4T of the substrate 4.

Furthermore, compared with the display device 2 according to the previous embodiment, the display device 2 according to this embodiment further includes a metal layer 36, inside the recessed space 24, between the upper surface 4T of the substrate 4 and the metal layer 26. The metal layer 36 contains, for example, the same material as any one of the materials of the anode 10 in each light-emitting element.

Otherwise, the display device 2 according to this embodiment may be the same in configuration as the display device 2 according to the previous embodiment. For example, the display device 2 according to this embodiment is the same as the display device 2 according to the previous embodiment in that the protruding portions 22 are provided out of the pixel P of the display device 2 in plan view. Furthermore, the protruding portions 22 according to this embodiment are the same in configuration as the protruding portions 22 according to the previous embodiment except for where to form the protruding portions 22. Hence, the side surfaces of the recessed space 24; that is, the side surfaces 22S of the protruding portions 22, are reverse-tapered.

In the display device 2 according to this embodiment, the protruding portions 22 and the recessed space 24 are provided on the upper surface 4T of the substrate 4. In other words, the protruding portions 22 according to this embodiment is formed in a position where the bank 16 is formed, and can be interpreted as a portion of the bank 16.

Accordingly, in this embodiment, the bank 16 is not formed in a position in which the recessed space 24 is formed. Such a feature makes the display device 2 thin. Thus, the display device 2 according to this embodiment further reduces stress developed in and around the recessed space 24 when the display device 2 is bent. Such a feature reduces development of defects such as a crack around the recessed space 24.

Furthermore, in this embodiment, the recessed space 24 includes therein the metal layer 36 in addition to the metal layer 26. Moreover, the metal layer 36 contains the same material as any one of the materials of the anode 10 serving as a reflective electrode in each light-emitting element according to this embodiment. Therefore, in this embodiment, visible light can be more highly likely to be emitted to a broken surface of the broken organic sealing film 20 inside the recessed space 24.

Figure 12:
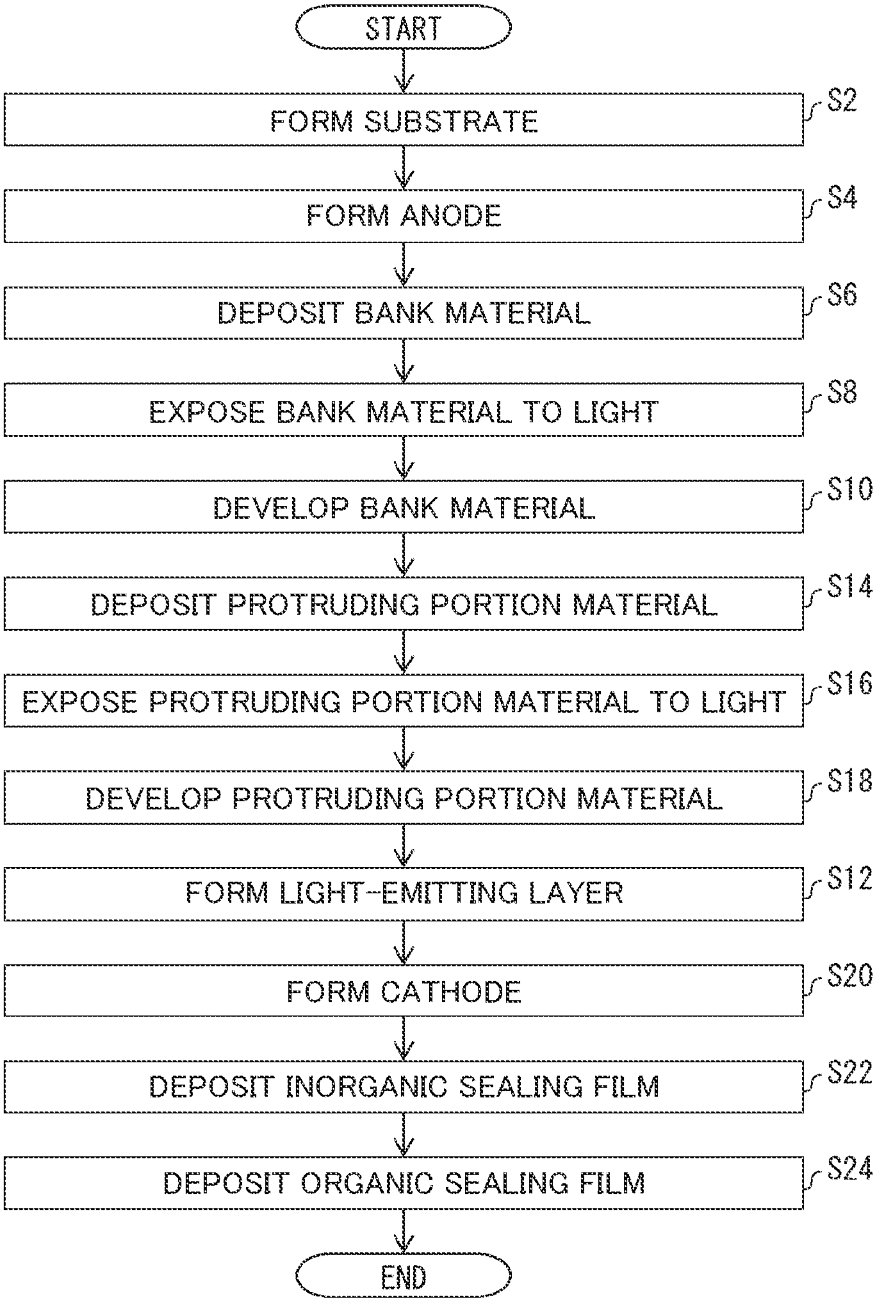
FIG. 12 is a flowchart illustrating a method for producing the display device according to the second embodiment.
Figure 13:
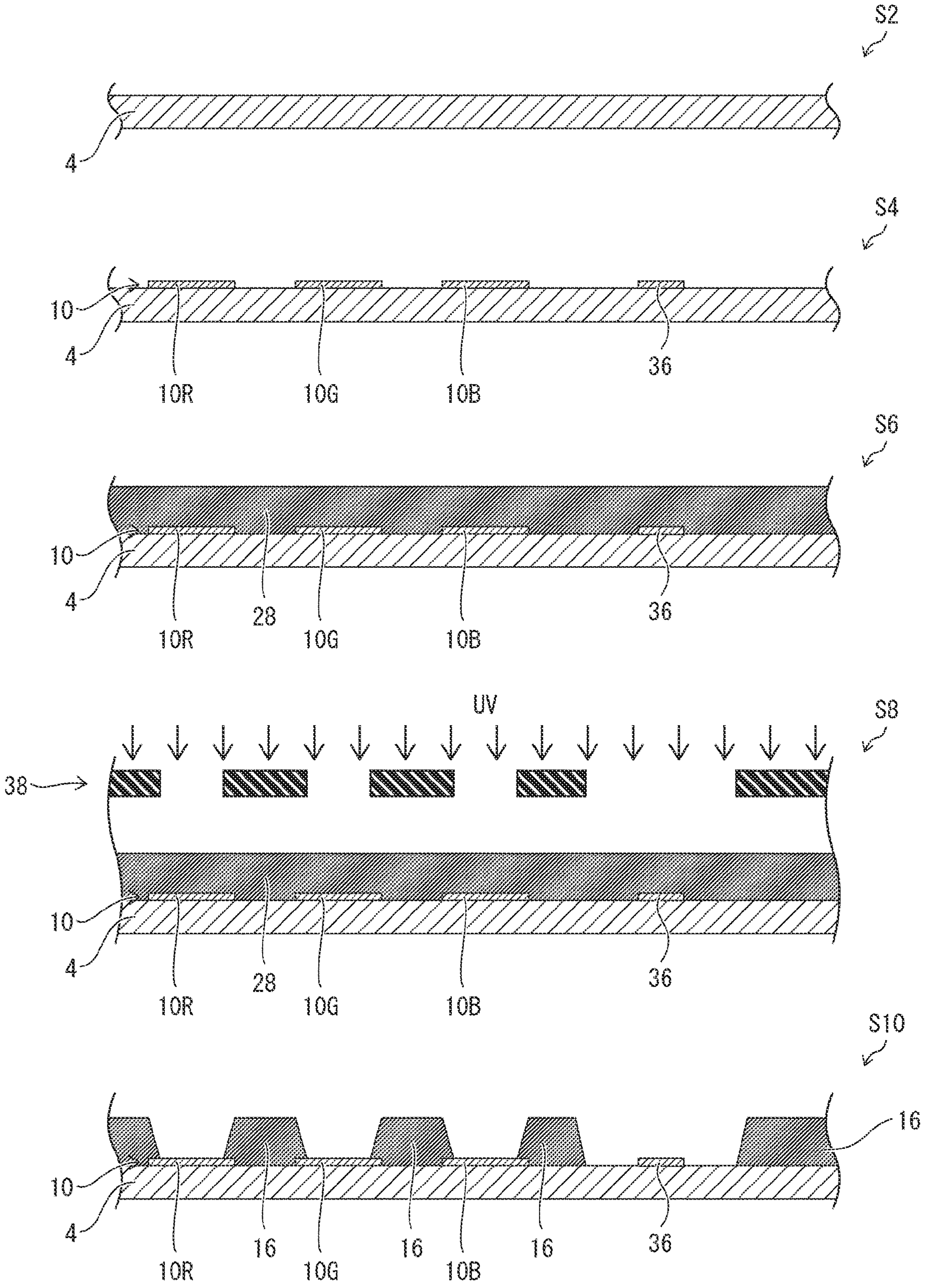
FIG. 13 illustrates cross-sectional views of steps included in the steps of producing the display device according to the second embodiment.
Figure 14:
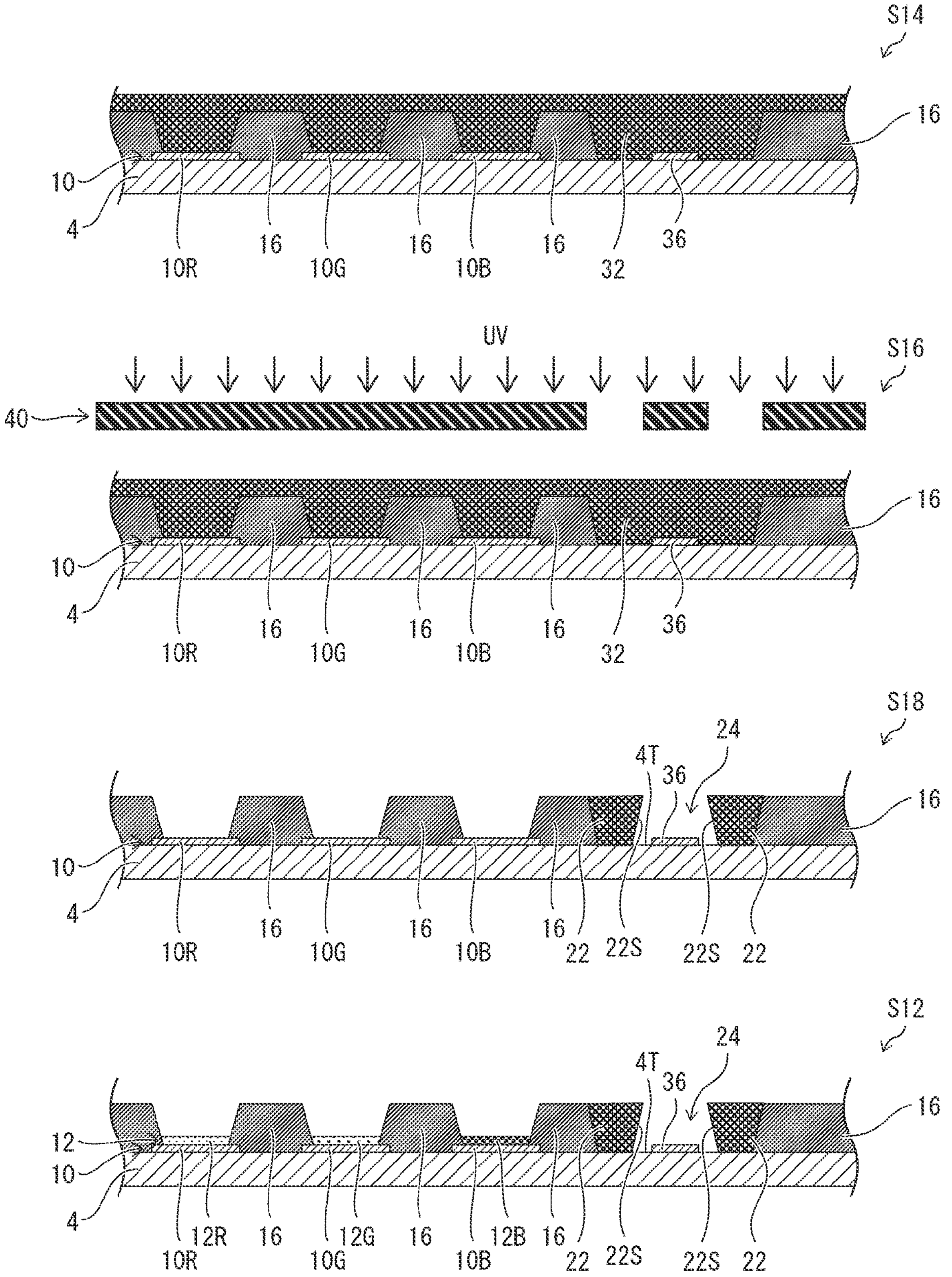
FIG. 14 illustrates cross-sectional views of other steps included in the steps of producing the display device according to the second embodiment.

Described below will be a method for producing the display device 2 according to this embodiment, with reference to FIGS. 12 to 14. FIG. 12 is a flowchart showing the method for producing the display device 2 according to this embodiment. FIGS. 13 and 14 illustrate cross-sectional views of the display device 2. Each of the cross-sectional views illustrates a step shown in the flowchart of FIG. 12. Each of FIGS. 13 and 14 illustrates cross-sections corresponding to the cross-section of the display device 2 illustrated in FIG. 10. Note that, in Description, details of production steps that can be carried out by the same techniques as those of the above production steps will not be repeatedly described and may be omitted.

In the method for producing the display device 2 according to this embodiment, first, the substrate 4 is formed by the same technique as that described at Step S2 of the previous embodiment. Next, the anodes 10 are formed by the same technique as that described at Step S4 of the previous embodiment. Here, in this embodiment, as illustrated at Step S4 of FIG. 13, the metal layer 36 is formed together with the anodes 10.

When a thin film of a conductive material is patterned at the step of forming the anodes 10, for example, the thin film of the conductive material is partially remained also out of the place where the pixel P is formed in plan view, in order to form the metal layer 36. Thanks to this technique, the metal layer 36 can be produced at the same step as that of forming the anodes 10. Such a feature eliminates the need for separately producing the metal layer 36. Therefore, the technique can reduce the risks of: complicating the steps of producing the display device 2; and increasing a tact time of the production steps.

Next, using the same technique as that at Step S6 of the previous embodiment, the bank material 28 containing a positive photosensitive resin is applied to the upper surfaces of the substrate 4 and the anodes 10. Next, using the same technique as that at Step S8 of the previous embodiment, the applied bank material 28 is exposed to light.

Here, at Step S8 according to this embodiment, the bank material 28 is exposed to light, using a photomask 38 having a light transparent portion positioned to overlap in plan view with the metal layer 36. Thus, using the same technique as that at Step S10 according to the previous embodiment to develop the bank material 28 exposed to light, the bank material 28 around the metal layer 36 is also removed. Hence, the banks 16 according to this embodiment are formed.

Next, using the same techniques as those at Steps S14, S16, and S18 of the previous embodiment, the protruding portion material 32 containing a negative photosensitive resin is applied, exposed to light, and developed. Here, at Step S16 according to this embodiment, the protruding portion material 32 is exposed to light, using a photomask 40 having a light transparent portion positioned not to overlap in plan view with the banks 16. Hence, the protruding portion material 32 is developed to form the protruding portions 22 on the upper surface 4T of the substrate 4.

Next, Steps S12, S20, S22, and S24 in the previous embodiment are sequentially carried out, and the display device 2 illustrated in FIG. 10 is successfully produced. Hence, in the method for producing the display device 2 according to this embodiment, the step of forming the protruding portions 22 is carried out prior to formation of the light-emitting layer 12. Hence, the method for producing the display device 2 according to this embodiment can prevent damage to the light-emitting layer 12 when, for example, the protruding portion material 32 is developed at the step of forming the protruding portion 22.

Third Embodiment

Example That Bank is Equivalent to Protruding Portion

Figure 15:
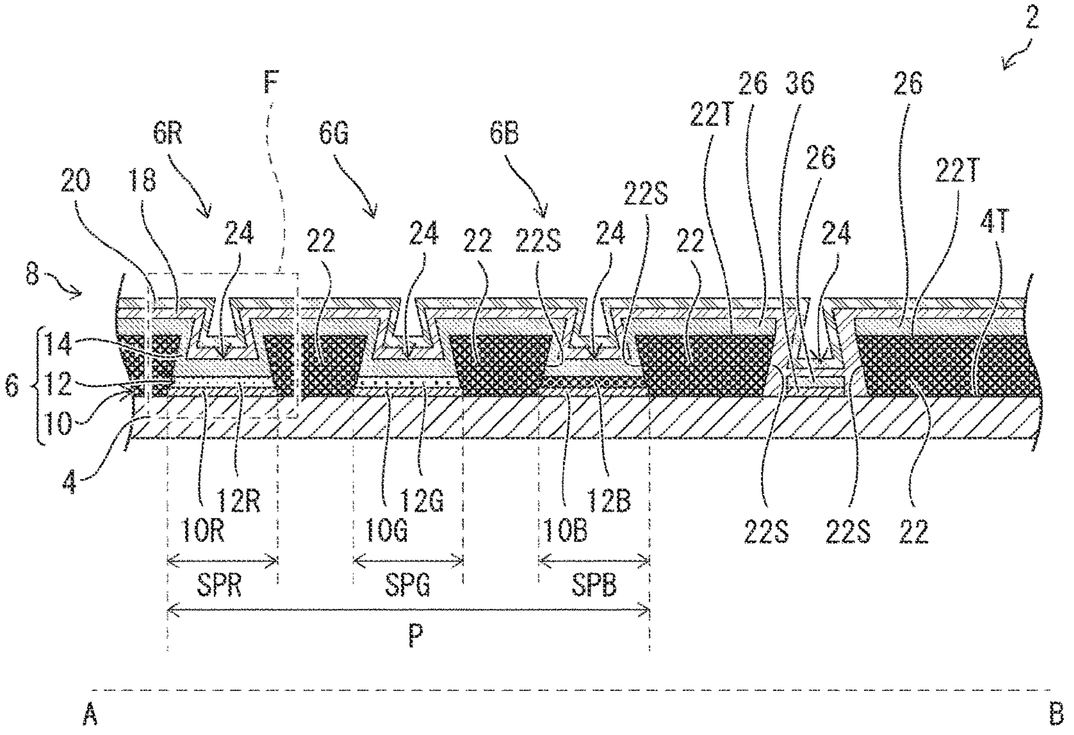
FIG. 15 is a schematic cross-sectional view of the display device according to a third embodiment.
Figure 16:
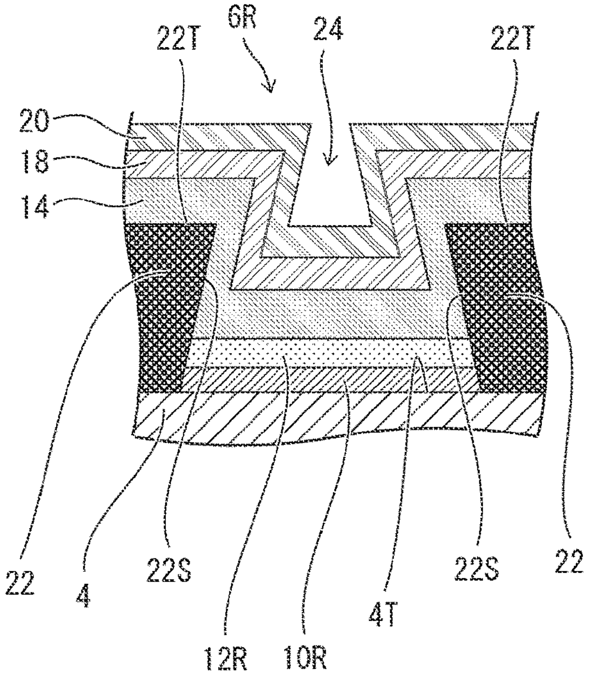
FIG. 16 is a partially enlarged cross-sectional view of the display device according to the third embodiment.

FIG. 15 is a cross-sectional view of a side of the display device 2 according to this embodiment. The cross-section corresponds to the cross-section illustrated in FIG. 1. FIG. 16 is an enlarged schematic view of, and around, the red light-emitting element 6R according to this embodiment, illustrating a region F in FIG. 15.

Compared with the display device 2 according to the previous embodiment, the display device 2 according to this embodiment has the protruding portions 22, instead of the banks 16, provided on the upper surface 4T of the substrate 4. In other words, the display device 2 according to this embodiment is interpreted as the display device 2, according to the previous embodiment, in which the banks to define the light-emitting elements may be equivalent to the protruding portion 22. Hence, the display device 2 according to this embodiment has protruding portions 22 included even inside the pixel P in plan view.

Thus, as illustrated in FIGS. 15 and 16, the display device 2 according to this embodiment includes each recessed space 24 formed between the protruding portions 22 even inside the pixel P in plan view. Furthermore, the display device 2 includes the light-emitting elements inside the respective recessed spaces 24. In this embodiment, on a lower surface of each of the recessed spaces 24, the anode 10, the light-emitting layer 12, and the cathode 14 are provided. Hence, in this embodiment, each recessed space 24 can be interpreted to include the anode 10 and the cathode 14 instead of the metal layer 26 and the metal layer 36.

Otherwise, the display device 2 according to this embodiment may be the same in configuration as the display device 2 according to the previous embodiment. For example, the protruding portions 22 according to this embodiment are the same in configuration as the protruding portions 22 according to the previous embodiment except for where to form the protruding portions 22. Hence, the side surfaces of the recessed spaces 24; that is, the side surfaces 22S of the protruding portions 22, are reverse-tapered.

The display device 2 according to this embodiment includes the protruding portions 22 serving as banks to define the light-emitting elements. Furthermore, the display device 2 according to this embodiment has the light-emitting elements included inside the respective recessed spaces 24 formed with the protruding portions 22. Thus, as to the display device 2 according to this embodiment, the recessed spaces 24 can alleviate stress generated in each of the members on the substrate 4 when the substrate 4 is bent, even if the stress is generated in a region in which each of the light-emitting elements is formed. Such a feature reduces development of defects in each light-emitting element.

Moreover, each of the light-emitting elements included in the display device 2 according to this embodiment includes, for example, the anode 10 serving as a reflective electrode provided closer to the substrate 4 than the cathode 14 serving as a transmissive electrode. In this case, as clearly illustrated in FIGS. 15 and 16, the recessed space 24 including therein any one of the light-emitting elements includes the anode 10 provided closer to the substrate 4 than the cathode 14.

Thanks to the above configuration, the display device 2 releases light of each of the light-emitting elements from toward the substrate 4 to toward the sealing layer 8. That is, the display device 2 is a top-emission display device. In this case, if the organic sealing film 20 is broken in a position overlapping in plan view with a light-emitting element, the broken surface of the broken organic sealing film 20 is irradiated not only with external light but also with light from the light-emitting layer 12 of the light-emitting element. Therefore, the display device 2 according to this embodiment can repair more efficiently defects of the organic sealing film 20 developed in a position overlapping with the light-emitting element.

Note that, as to the display device 2 according to this embodiment, all the banks 16 included in the display device 2 according to the previous embodiment are equivalent to the protruding portions 22. However, the display device 2 according to the disclosure shall not be limited to such a configuration. For example, the display device 2 according to this embodiment allow only banks 16 positioned on outermost edges of each pixel P in plan view to serve as the protruding portions 22, among the banks 16 included in the display device 2 according to the previous embodiment.

In this case, the red light-emitting element 6R, the green light-emitting element 6G, and the blue light-emitting element 6B formed in the pixel P are positioned between the protruding portions 22. Hence, in the above-described structure, each recessed space 24 includes therein a plurality of light-emitting elements. Therefore, the display device 2 according to this embodiment shall not be limited to a configuration in which each recessed space 24 includes a single light-emitting element. Alternatively, the display device 2 may have a configuration in which each recessed space 24 may include a plurality of light-emitting elements.

Furthermore, the display device 2 according to this embodiment is a bottom-emission display device that releases light from each of the light-emitting elements not toward the sealing layer 8 but toward the substrate 4. In this embodiment, a space provided between the protruding portions 22 for forming the light-emitting element is larger in area toward the substrate 4 from which the light is released than toward the sealing layer 8 in plan view. Hence, if the display device 2 according to this embodiment is a bottom-emission display device, the protruding portions 22 are less likely to block light from each of the light-emitting layers 12. Such a feature reduces a decrease in efficiency of releasing light from each of the light-emitting elements.

Figure 17:
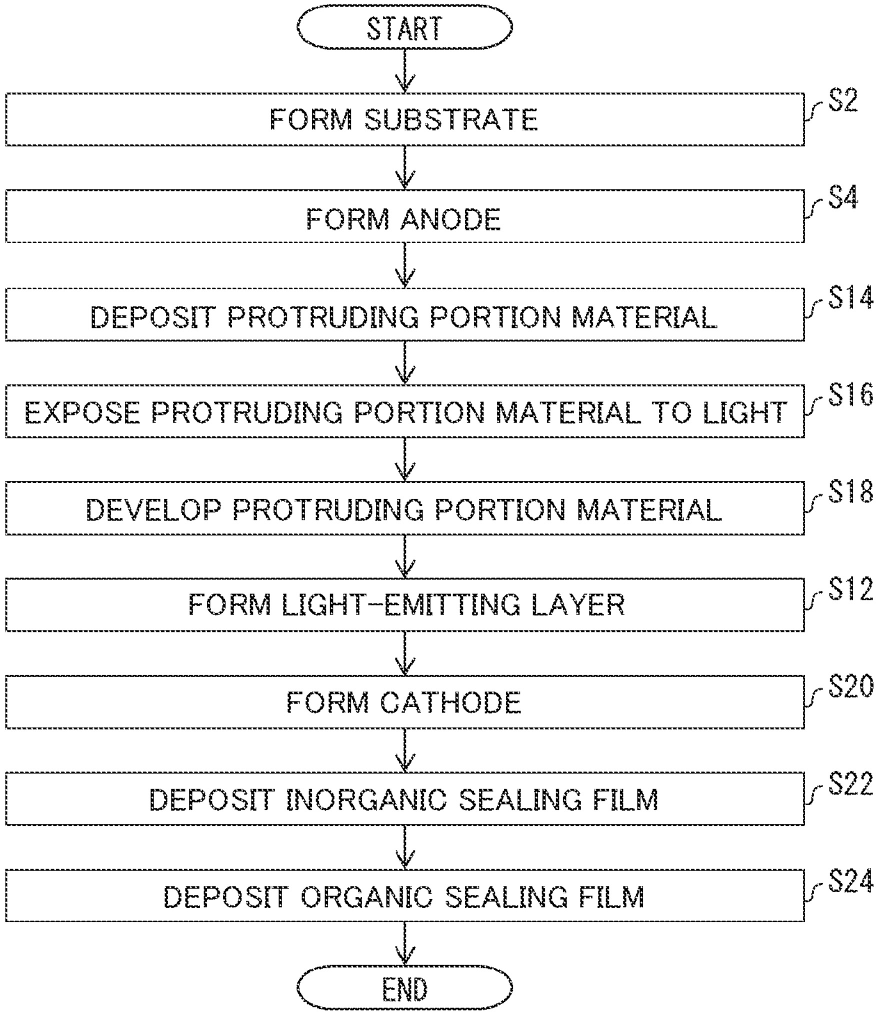
FIG. 17 is a flowchart illustrating a method for producing the display device according to the third embodiment.
Figure 18:
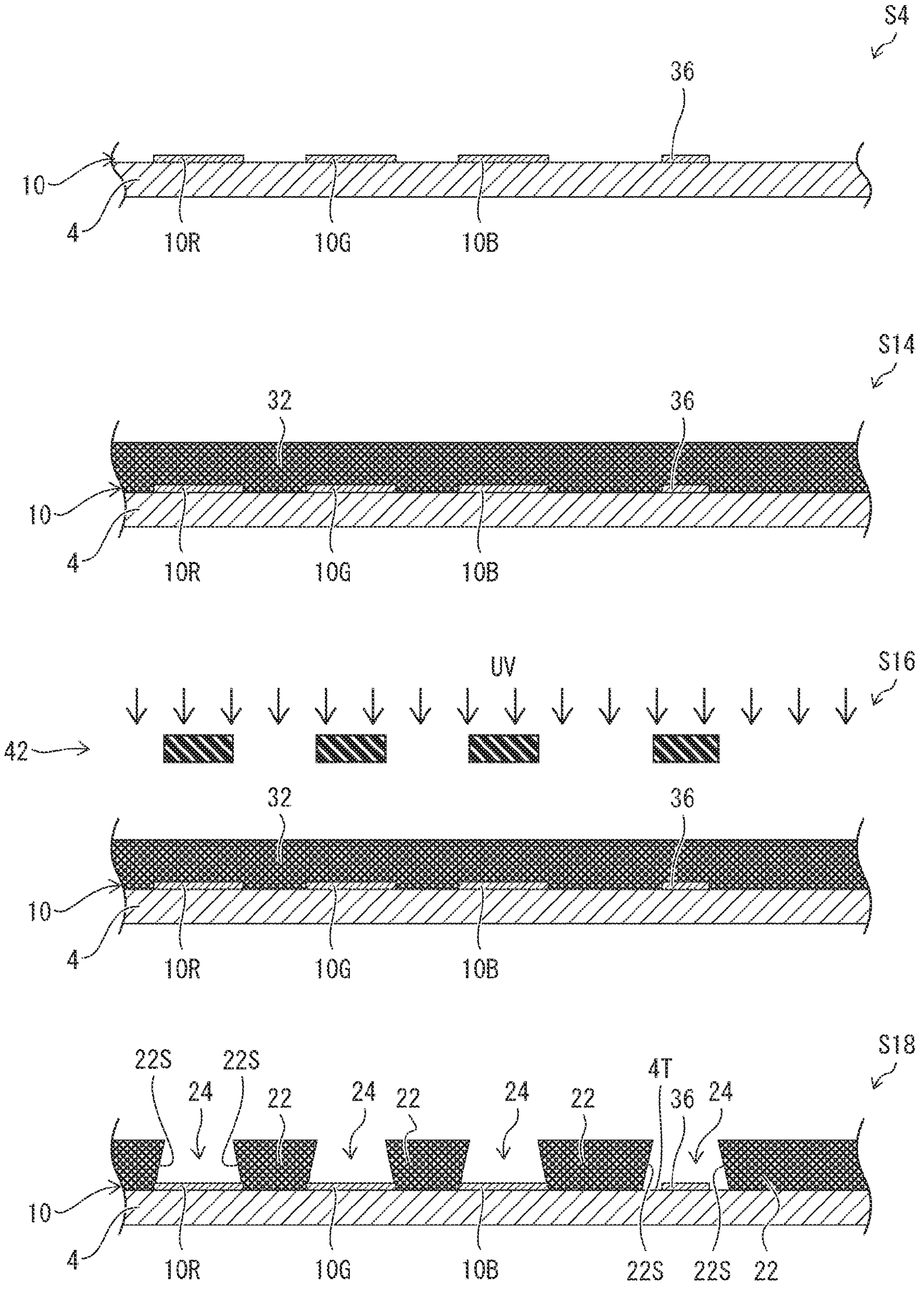
FIG. 18 illustrates cross-sectional views of steps included in the steps of producing the display device according to the third embodiment.

Described below will be a method for producing the display device 2 according to this embodiment, with reference to FIGS. 17 and 18. FIG. 17 is a flowchart showing the method for producing the display device 2 according to this embodiment. FIG. 18 illustrates cross-sectional views of the display device 2. Each of the cross-sectional views illustrates a step shown in the flowchart of FIG. 17. FIG. 18 illustrates cross-sections corresponding to the cross-section of the display device 2 illustrated in FIG. 15.

In the method for producing the display device 2 according to this embodiment, the same production steps as Step S2 and Step S4 according to the previous embodiment are sequentially carried out to form the substrate 4, the anode 10, and the metal layer 36. Next, this embodiment omits the step of forming the banks 16, and carries out the step of forming the protruding portions 22.

At the step of forming the protruding portions 22 according to this embodiment, the protruding portion material 32 containing a negative photosensitive resin is applied, exposed to light, and developed by the same techniques as those at Steps S14, S16, and S18 according to the previous embodiment. Here, at Step S16 according to this embodiment, the protruding portion material 32 is exposed to light, using the photomask 42 having a light transparent portion positioned to overlap in plan view with each anode 10 and the metal layer 36. Hence, the protruding portion material 32 is developed to form the protruding portions 22 between the anodes 10 and between an anode 10 and the metal layer 36.

Next, Steps S12, S20, S22, and S24 in the previous embodiment are sequentially carried out, and the display device 2 illustrated in FIG. 15 is successfully produced.

The method for producing the display device 2 according to this embodiment omits the step of forming the banks 16. In other words, as to the method for producing the display device 2 according to this embodiment, the step of forming the banks 16 according to the first to third embodiments is interpreted the same as the step of forming the protruding portions 22.

Thanks to such a feature, the method for producing the display device 2 according to this embodiment is simple, compared with a method in which the step of forming the banks 16 is separately carried out. Furthermore, no material has to be used to form the banks 16. Therefore, the method for producing the display device 2 according to this embodiment achieves reduction in tact time and production costs at the steps of producing the display device 2.

Fourth Embodiment

Protruding Portion Having Forward-Tapered Surface

Figure 19:
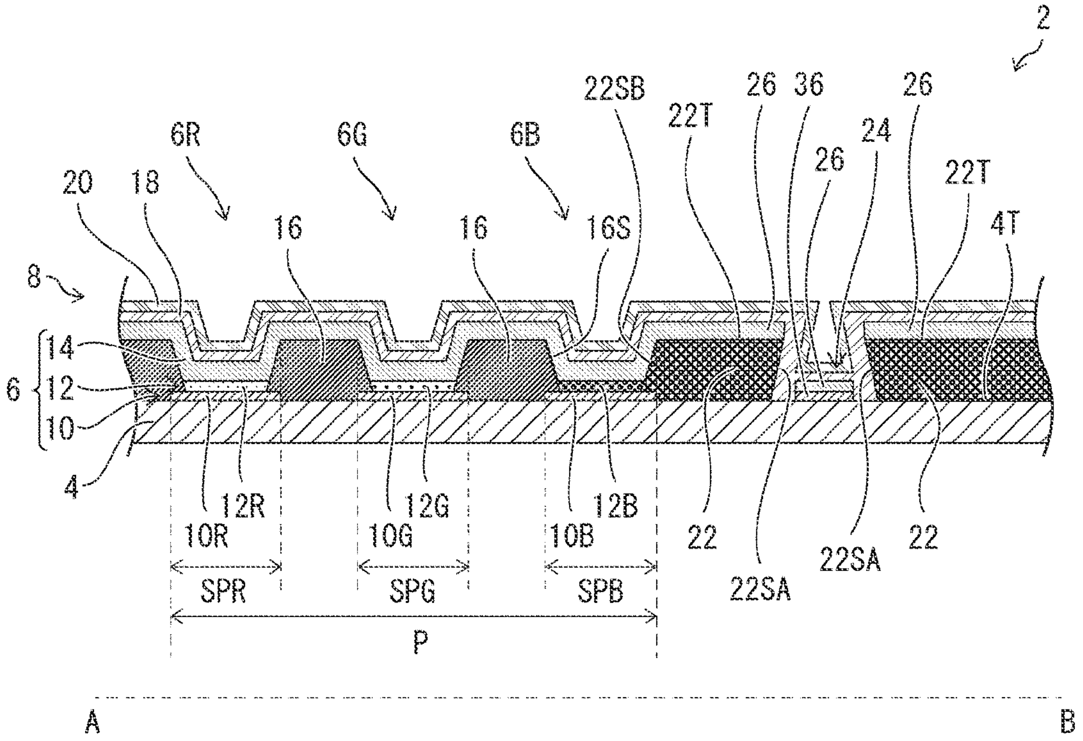
FIG. 19 is a schematic cross-sectional view of the display device according to a fourth embodiment.

FIG. 19 is a cross-sectional view of a side of the display device 2 according to this embodiment. The cross-section corresponds to the cross-section illustrated in FIG. 1.

The display device 2 according to this embodiment is the display device 2, according to the second embodiment, in which a bank 16 in contact with a protruding portion 22 serves as the protruding portion 22. Hence, as illustrated in FIG. 19, the side surface 22S of the protruding portion 22 according to this embodiment includes: a first side surface 22SA that is a reverse-tapered surface; and a second side surface 22SB that is a forward-tapered surface. In other words, the side surface 22S according to this embodiment includes not only a reverse-tapered surface, but also partially includes a forward-tapered surface.

In particular, the display device 2 according to this embodiment includes, as illustrated in FIG. 19, the pixel P formed toward the second side surface 22SB of the side surface 22S of the protruding portion 22. In other words, the display device 2 according to this embodiment includes each of the light-emitting elements toward the forward-tapered surface of the side surface 22S of the protruding portion 22. In particular, in this embodiment, the protruding portion 22 is adjacent to the blue light-emitting element 6B among the light-emitting elements included in the display device 2, and has the second side surface 22SB toward the blue light-emitting element 6B.

On the other hand, the side surface 22S of the protruding portion 22 includes the first side surface 22SA across from the forward-tapered surface; in other words, outside the pixel Pin plan view. Hence, the display device 2 according to this embodiment includes the recessed space 24 at the first side surface 22SA of the protruding portion 22; that is, outside the pixel P in plan view.

Hence, similar to the recessed spaces 24 formed in the display device 2 according to the embodiments described above, the recessed space 24 formed in the display device 2 according to this embodiment has a side surface provided with a reverse-tapered surface including the first side surface 22SA. Thus, as to the display device 2 according to this embodiment, the recessed space 24 can alleviate stress generated in each of the members on the substrate 4 when the substrate 4 is bent, thereby reducing development of defects in each of the light-emitting elements.

In addition, in this embodiment, the side surface 22S of the protruding portion 22 further includes the second side surface 22SB that is a forward-tapered surface. The second side surface 22SB faces the light-emitting elements. Hence, in the display device 2 according to this embodiment, a light-emitting element adjacent to the protruding portion 22 is also provided between side walls of the forward-tapered surfaces. Hence, if the display device 2 according to this embodiment is a top-emission display device, the protruding portion 22 is less likely to block light from a light-emitting layer 12 included in the light-emitting element adjacent to the protruding portion 22.

Figure 20:
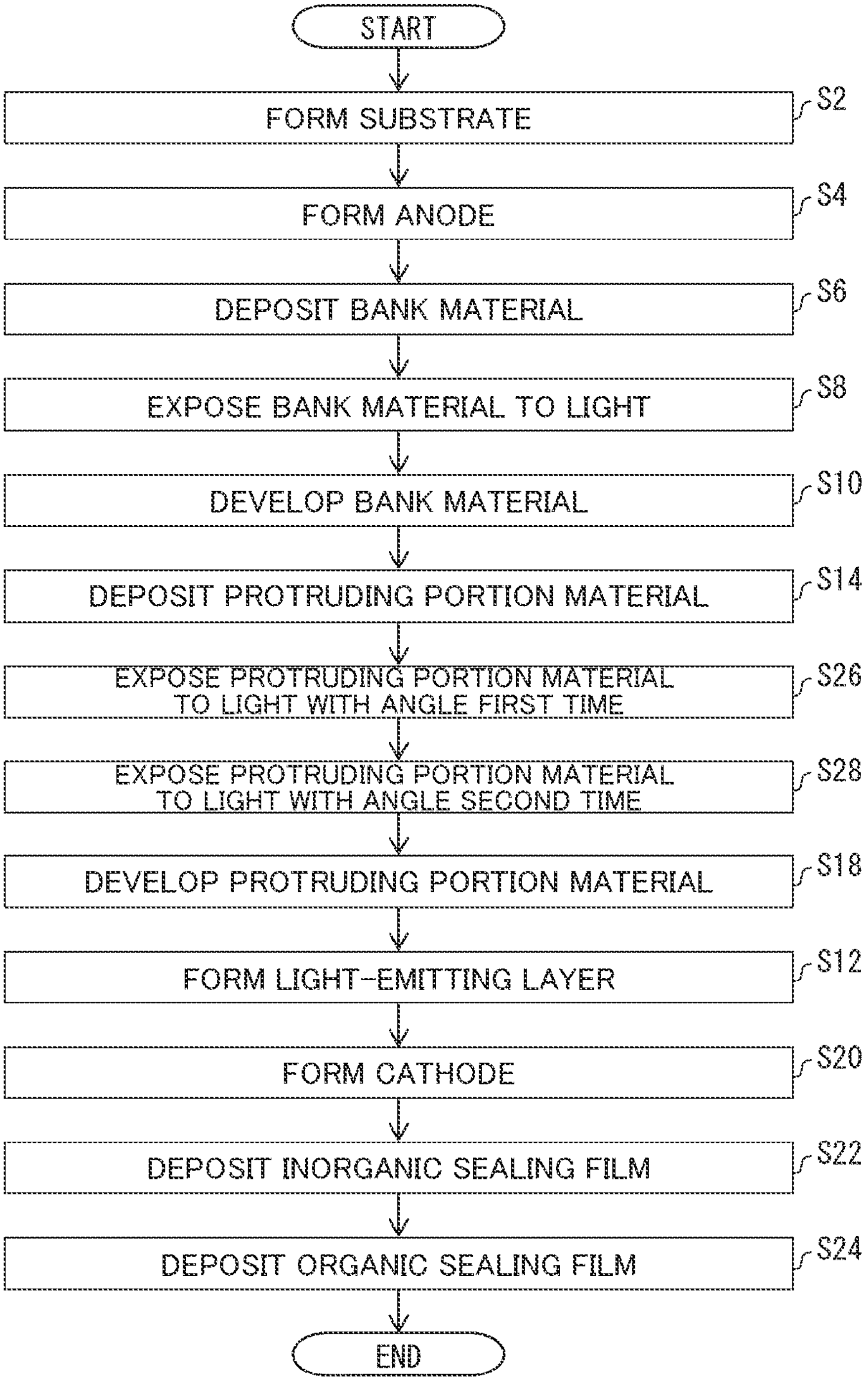
FIG. 20 is a flowchart illustrating a method for producing the display device according to the fourth embodiment.
Figure 21:
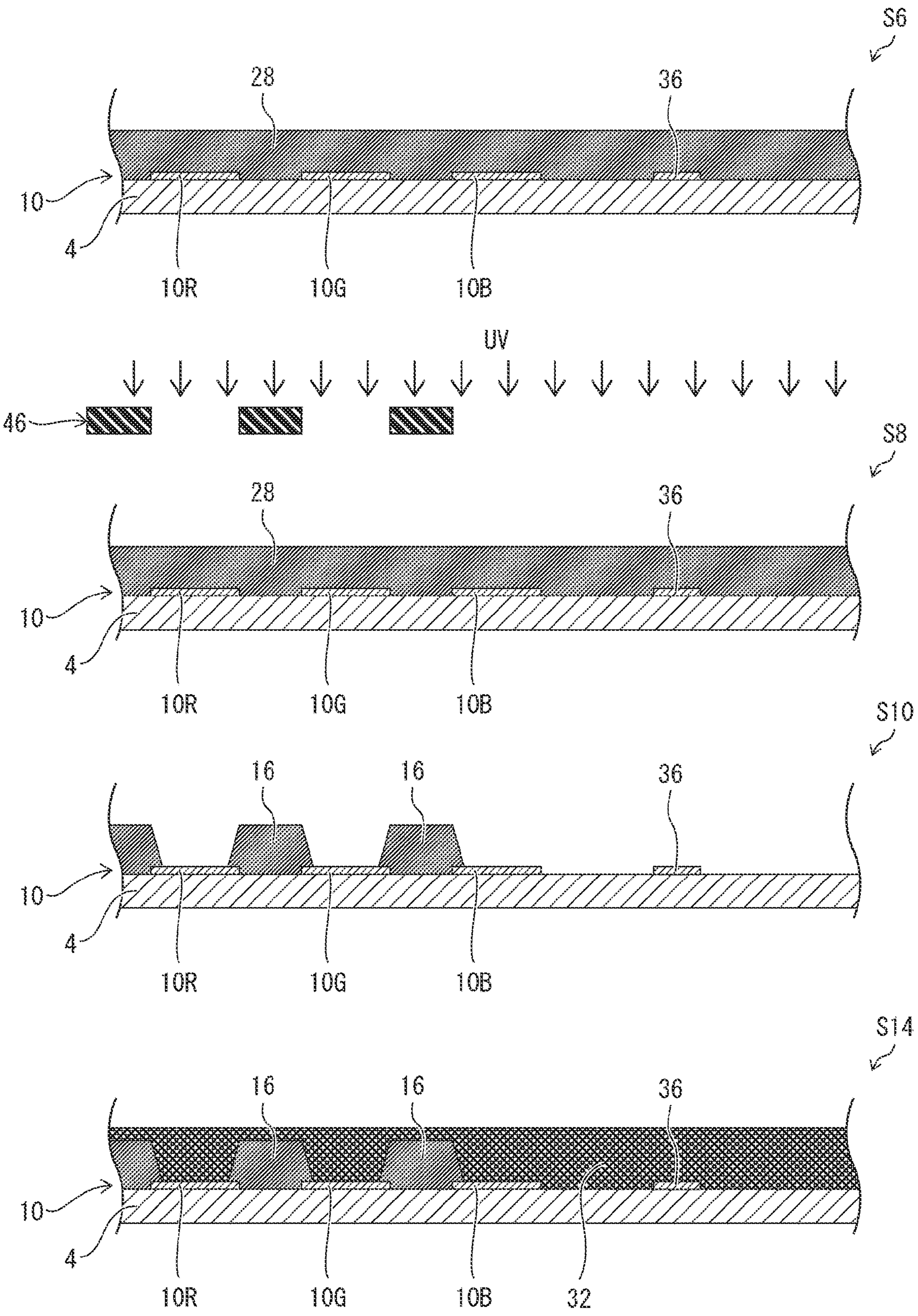
FIG. 21 illustrates cross-sectional views of steps included in the steps of producing the display device according to the fourth embodiment.
Figure 22:
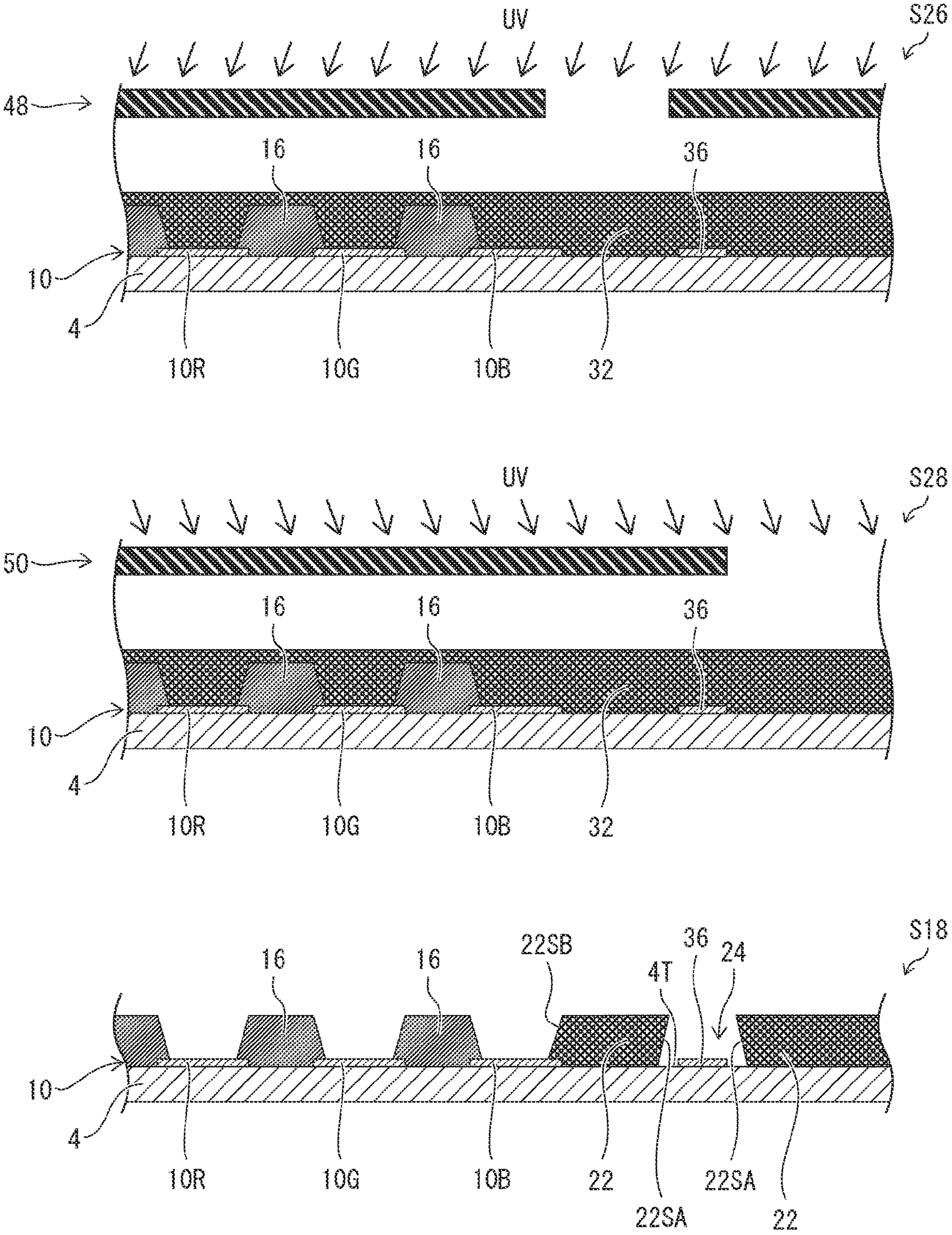
FIG. 22 illustrates cross-sectional views of other steps included in the steps of producing the display device according to the fourth embodiment.

Described below will be a method for producing the display device 2 according to this embodiment, with reference to FIGS. 20 to 22. FIG. 20 is a flowchart showing the method for producing the display device 2 according to this embodiment. FIGS. 21 and 22 illustrate cross-sectional views of the display device 2. Each of the cross-sectional views illustrates a step shown in the flowchart of FIG. 20. Each of FIGS. 21 and 22 illustrates cross-sections corresponding to the cross-section of the display device 2 illustrated in FIG. 19.

In the method for producing the display device 2 according to this embodiment, the same production steps as Step S2 and Step S4 according to the second embodiment are sequentially carried out to form the substrate 4, the anode 10, and the metal layer 36. Next, using the same techniques as those at Steps S6, S8, and S10 of the second embodiment, the bank material 28 containing a positive photosensitive resin is applied, exposed to light, and developed.

Here, at Step S8 according to this embodiment, the bank material 28 is exposed to light, using a photomask 46 with no light transparent portion provided between the anode 10B and the metal layer 36 in plan view. Hence, at the step of forming the banks 16 according to this embodiment, no bank 16 is formed in a place, on the anode 10B, covering a peripheral end portion toward the metal layer 36.

Next, using the same technique as that at Step S14 of the embodiments described above, the protruding portion material 32 containing a negative photosensitive resin is applied. Next, the protruding portion material 32 is exposed to light. Here, in this embodiment, following Step S14, for example, a photomask 48 is placed to expose the protruding portion material 32 to light first time (Step S26). The photomask 48 has a light transparent portion between the anode 10B and the metal layer 36 in plan view. In particular, at Step S26, ultraviolet rays UV are emitted from above the photomask 48 in a direction inclined from toward the metal layer 36 to toward the anode 10B with respect to a direction normal to the upper surface 4T of the substrate 4.

Next, for example, a photomask 50 is placed to expose the protruding portion material 32 to light second time (Step S28). The photomask 50 has a light transparent portion provided across the metal layer 36 further from the anode 10B in plan view. In particular, at Step S28, the ultraviolet rays UV are emitted from above the photomask 50 in a direction inclined from toward the anode 10B to toward the metal layer 36 with respect to a direction normal to the upper surface 4T of the substrate 4.

Next, using the same technique as that at Step S18 of the embodiments described above, the protruding portion material 32 is developed. Here, at Steps S26 and S28, the protruding portion material 32 is exposed to light between the anode 10B and the metal layer 36 and across the metal layer 36 further from the anode 10B in plan view.

In addition, a portion included in the protruding portion material 32 exposed to light and positioned between the anode 10B and the metal layer 36 in plan view is exposed to the ultraviolet rays UV from above in a direction to the substrate 4 from toward the metal layer 36 to toward the anode 10B. Therefore, at Step S18, a protruding portion 22 is formed between the anode 10B and the metal layer 36 in plan view. The protruding portion 22 has: the first side surface 22SA that is a reverse-tapered surface provided toward the metal layer 36; and the second side surface 22SB that is a forward-tapered surface provided toward the anode 10B.

Furthermore, a portion included in the protruding portion material 32 exposed to light and positioned across the metal layer 36 further from the anode 10B in plan view is exposed to the ultraviolet rays UV from above in a direction to the substrate 4 from toward the anode 10B to toward the metal layer 36. Therefore, at Step S18, a protruding portion 22 is formed across the metal layer 36 further from the anode 10B in plan view. The protruding portion 22 has the first side surface 22SA that is a reverse-tapered surface provided toward the metal layer 36. Note that, although omitted in FIG. 22 for simplicity of illustration, the protruding portion 22, positioned across the metal layer 36 further from the anode 10B in plan view, has the second side surface 22SB that is a forward-tapered surface provided across the metal layer 36 further from the anode 10B.

Next, Steps S12, S20, S22, and S24 in the previous embodiment are sequentially carried out, and the display device 2 illustrated in FIG. 19 is successfully produced.

In this embodiment, at the step of forming the protruding portions 22, a photosensitive material is patterned by photolithography to form the protruding portion 22. Furthermore, in this embodiment, at the step of exposing to light in the photolithography, the ultraviolet rays UV are emitted in a direction inclined from the direction normal to the upper surface 4T of the substrate 4. Hence, the protruding portion material 32 of a single material can form the protruding portion 22 including both the first side surface 22SA that is a reverse-tapered surface and the second side surface 22SB that is a forward-tapered surface.

Moreover, in this embodiment, the protruding portion 22 including both the first side surface 22SA and the second side surface 22SB is formed, as described above, at the step of exposing to the ultraviolet rays UV emitted in a direction inclined from the direction normal to the upper surface 4T of the substrate 4. Hence, the protruding portion material 32 may be a positive photosensitive material instead of a negative photosensitive material. In this case, for example, at Step S26 and Step S28, respectively, the photomask 48 and the photomask 50 may have the light blocking portion and the light transparent portion inverted for exposure to light. Hence, the protruding portion 22 according to this embodiment can be formed. Note that at both Step S26 and Step S28, a light blocking portion is desirably added to the photomasks as appropriate, so that, at each of Step S26 and Step S28, a portion of the positive protruding portion material 32 forming the protruding portion 22 is not exposed to light.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

The invention claimed is:

1. A display device, comprising:

a substrate that is flexible;

a protruding portion having a side surface at least partially including a reverse-tapered surface on the substrate;

a sealing layer containing a self-repairing material; and a recessed space formed with the side surface of the protruding portion and a surface on which the protruding portion is formed, wherein the sealing layer covers the side surface and an upper surface of the protruding portion and a lower surface of the recessed space, and the recessed space has a side surface at least partially including the reverse-tapered surface including reverse-tapered surfaces.

2. The display device according to claim 1, wherein the sealing layer includes an inorganic sealing film and an organic sealing film sequentially stacked from toward the substrate, the inorganic sealing film covering: the upper surface and the side surface of the protruding portion; and the lower surface of the recessed space, and the organic sealing film being provided over the inorganic sealing film, and the organic sealing film contains the self-repairing material.

3. The display device according to claim 1, wherein the self-repairing material contains a photosensitive polymer having a plurality of photosensitive bonding groups bonding to each other, each bonding of the plurality of photosensitive bonding groups is irradiated with light and radicalized to be broken, and the photosensitive bonding groups that are broken have broken ends, and the broken ends come close to each other such that the broken photosensitive bonding groups recombine with each other.

4. The display device according to claim 2, further comprising a metal layer formed on the lower surface of the recessed space.

5. The display device according to claim 1, wherein the reverse-tapered surface at least partially reflects or scatters visible light.

6. The display device according to claim 1, wherein angles formed between: the reverse-tapered surfaces forming the side surface of the recessed space; and the lower surface of the recessed space are equivalent in at least one recessed space including the recessed space.

7. The display device according to claim 1, further comprising:

a plurality of light-emitting elements each including two electrodes and a functional layer between the two electrodes; and a bank formed between the plurality of light-emitting elements and separating the light-emitting elements from each other.

8. The display device according to claim 7, wherein at least a portion of the protruding portion is provided on an upper surface of the bank.

9. The display device according to claim 7, wherein at least the portion of the protruding portion is a portion of the bank.

10. The display device according to claim 9, wherein the protruding portion includes at least one protruding portion, the at least one protruding portion has the side surface, the side surface includes a surface different from the reverse-tapered surface, and the surface at least partially includes a forward-tapered surface, and the light-emitting elements are provided not toward the protruding portion but toward the forward-tapered surface of the protruding portion.

11. The display device according to claim 7, wherein the protruding portion is equivalent to the bank.

12. The display device according to claim 7, wherein at least one of the light-emitting elements is included in at least one recessed space including the recessed space.

13. The display device according to claim 12, in the at least one light-emitting element included in the at least one recessed space, one of the two electrodes toward the substrate is a reflective electrode.

14. A method for producing a display device, comprising:

a protruding portion forming step of forming a protruding portion on a substrate that is flexible to form a recessed space, the protruding portion having a side surface at least partially including a reverse-tapered surface, the recessed space being formed with the side surface of the protruding portion and a surface on which the protruding portion is formed, and the recessed space having a side surface at least partially including the reverse-tapered surface; and a sealing layer forming step of forming a sealing layer covering the side surface and an upper surface of the protruding portion, and a lower surface of the recessed space, the sealing layer containing a self-repairing material.

15. The method for producing the display device according to claim 14, wherein the sealing layer forming step includes:

an inorganic sealing film depositing step of depositing an inorganic sealing film covering the upper surface and the side surface of the protruding portion, and the lower surface of the recessed space; and an organic sealing film depositing step of depositing an organic sealing film over the inorganic sealing film, the organic sealing film containing the self-repairing material.

16. The method for producing the display device according to claim 14, further comprising:

a light-emitting element forming step of forming a plurality of light-emitting elements each including two electrodes and a light-emitting layer between the two electrodes; and a bank forming step of forming a bank between the plurality of light-emitting elements, the bank separating the light-emitting elements from each other.

17. The method for producing the display device according to claim 16, wherein after the bank forming step, the protruding portion forming step is carried out, and at the protruding portion forming step, the protruding portion is formed on the bank.

18. The method for producing the display device according to claim 16, wherein the protruding portion is equivalent to the bank, and the bank forming step is equivalent to the protruding portion forming step.

19. The method for producing the display device according to claim 14, wherein, at the protruding portion forming step, the protruding portion is formed of a negative photosensitive resin and patterned by photolithography.

20. The method for producing the display device according to claim 14, wherein the protruding portion includes at least one protruding portion, the at least one protruding portion has the side surface, the side surface includes a surface different from the reverse-tapered surface, and the surface at least partially includes a forward-tapered surface, and at the protruding portion forming step, the protruding portion is formed by photolithography including a light exposure step at which light is emitted in a direction inclined from a direction normal to an upper surface of the substrate.

* * * * *